United States Patent
Lin et al.

(10) Patent No.: US 10,177,090 B2
(45) Date of Patent: Jan. 8, 2019

(54) PACKAGE-ON-PACKAGE SEMICONDUCTOR ASSEMBLY HAVING BOTTOM DEVICE CONFINED BY DIELECTRIC RECESS

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 241 days.

(21) Appl. No.: 15/015,050

(22) Filed: Feb. 3, 2016

(65) Prior Publication Data
US 2017/0033083 A1    Feb. 2, 2017

Related U.S. Application Data

(63) Continuation-in-part of application No. 14/957,954, filed on Dec. 3, 2015, now Pat. No. 9,913,385.
(Continued)

(51) Int. Cl.
*H01L 25/065*    (2006.01)
*H01L 23/528*    (2006.01)
(Continued)

(52) U.S. Cl.
CPC ........ *H01L 23/528* (2013.01); *H01L 23/3142* (2013.01); *H01L 23/49811* (2013.01);
(Continued)

(58) Field of Classification Search
CPC .......... H01L 25/0657; H01L 23/49838; H01L 23/49827; H01L 24/32; H01L 23/5389; H01L 23/3142; H01L 23/528; H01L 2225/06548; H01L 2224/32225; H01L 2924/15153; H01L 2225/06555;
(Continued)

(56) References Cited

U.S. PATENT DOCUMENTS 6,955,948 B2    10/2005    Asahi et al.
8,072,059 B2    12/2011    Shim et al.
(Continued)

FOREIGN PATENT DOCUMENTS

| CN | 102214626 A | 10/2011 |
| CN | 103515247 A | 1/2014 |
| CN | 103716992 A | 4/2014 |

*Primary Examiner* — Thanh T Nguyen
(74) *Attorney, Agent, or Firm* — Pai Patent & Trademark Law Firm; Chao-Chang David Pai

(57) ABSTRACT

A package-on-package semiconductor assembly is characterized by a semiconductor device positioned in a dielectric recess of a core base and surrounded by an array of metal posts. The recess in the core provides lateral displacement control between the device and the metal posts, and the minimal height of the metal posts needed for the vertical connection between two both opposite sides of the core base can be reduced by the amount equal to the depth of the recess. Further, another semiconductor device is disposed over a top surface of the core base and is electrically coupled to the semiconductor device in the dielectric recess through a buildup circuitry under a bottom surface of the core base.

7 Claims, 16 Drawing Sheets

Related U.S. Application Data

(60) Provisional application No. 62/198,058, filed on Jul. 28, 2015.

(51) Int. Cl.
    *H01L 23/498*     (2006.01)
    *H01L 23/538*     (2006.01)
    *H01L 23/31*     (2006.01)
    *H01L 25/11*     (2006.01)
    *H01L 21/56*     (2006.01)

(52) U.S. Cl.
CPC .. *H01L 23/49827* (2013.01); *H01L 23/49838* (2013.01); *H01L 23/5389* (2013.01); *H01L 25/117* (2013.01); *H01L 21/561* (2013.01); *H01L 2224/16235* (2013.01); *H01L 2224/16238* (2013.01); *H01L 2224/81005* (2013.01); *H01L 2224/97* (2013.01); *H01L 2924/15311* (2013.01); *H01L 2924/15313* (2013.01)

(58) Field of Classification Search
CPC ............. H01L 25/117; H01L 23/49811; H01L 2224/16235; H01L 2224/81005; H01L 2924/15311; H01L 21/561; H01L 2224/97
See application file for complete search history.

(56) References Cited

U.S. PATENT DOCUMENTS

| | | |
|---|---|---|
| 8,193,034 B2 | 6/2012 | Pagaila et al. |
| 8,344,492 B2 | 1/2013 | Chino |
| 8,354,746 B2 | 1/2013 | Huang et al. |
| 8,383,457 B2 | 2/2013 | Pagaila et al. |
| 8,501,544 B2 | 8/2013 | Pagaila |
| 8,525,337 B2 | 9/2013 | Pendse |
| 8,536,715 B2 | 9/2013 | Chino |
| 8,916,481 B2 | 12/2014 | Gan et al. |
| 9,214,450 B2 | 12/2015 | Wu |
| 2013/0192884 A1* | 8/2013 | Furutani ............... H05K 1/185 174/258 |
| 2015/0156880 A1* | 6/2015 | Daizo .................... H05K 1/183 174/251 |

* cited by examiner

PACKAGE-ON-PACKAGE SEMICONDUCTOR ASSEMBLY HAVING BOTTOM DEVICE CONFINED BY DIELECTRIC RECESS

CROSS REFERENCE TO RELATED APPLICATIONS

This application is a continuation-in-part of U.S. application Ser. No. 14/957,954 filed Dec. 3, 2015. This application also claims the benefit of filing date of U.S. Provisional Application Ser. No. 62/198,058 filed Jul. 28, 2015. The entirety of each of said applications is incorporated herein by reference.

FIELD OF THE INVENTION

The present invention relates to a package-on-package semiconductor assembly, more particularly, to a package-on-package semiconductor assembly having a bottom device confined by a recess of a dielectric layer and surrounded by an array of metal posts.

DESCRIPTION OF RELATED ART

The convergence of mobility, communication, and computing has created significant thermal, electrical and reliability challenges to the semiconductor package industry. Despite numerous package-on-package assemblies reported in the literature, many deficiencies remain. For example, the package-on-package assemblies disclosed in U.S. Pat. Nos. 9,214,450, 8,916,481, 8,525,337 and 8,344,492 utilize through mold via, through-hole in interposer or stud bump respectively to form vertical channels so as to electrically connect the top and bottom devices. However, with the advances of mobile modules, the number of I/Os that need to be connected between devices steadily increase. As a result, these vertical channel approaches present a crowding problem that can cause shorting between neighboring connections.

Another significant drawback arising from the fabrication of the above assemblies is that the embedded/bottom device may dislocate during encapsulation or lamination. Incomplete metallization of micro-vias due to device dislocation as described in U.S. Pat. No. 8,501,544 further degrades the quality of the electrical connection, thereby lowering the reliability and production yield of the fabricated assembly.

For the reasons stated above, and for other reasons stated below, an urgent need exists to provide a new package-on-package semiconductor assembly that can address better signal integrity, high yield and low cost requirements.

SUMMARY OF THE INVENTION

A primary objective of the present invention is to provide a package-on-package semiconductor assembly having a bottom device laterally confined by a recess of a dielectric layer so that the displacement of the embedded bottom device can be controlled.

Another objective of the present invention is to provide a package-on-package semiconductor assembly having an array of metal posts formed in a core base for vertical interconnection. As both the recess and the metal posts originated from a same metal carrier, the pre-determined relative location between the metal posts and the embedded bottom device can be guaranteed.

Yet another objective of the present invention is to provide a package-on-package semiconductor assembly having both the recess and the metal posts enclosed in the core base. As the minimal height of the metal posts needed for the vertical connection between opposite sides of the core base can be compensated for by the amount equal to the depth of the recess, the manufacturing yield and cost can be greatly improved.

In accordance with the foregoing and other objectives, the present invention provides a package-on-package semiconductor assembly that includes a core base, a first semiconductor device, a bottom buildup circuitry and a second semiconductor device. In a preferred embodiment, the core base includes a dielectric layer, a resin sealant layer and an array of metal posts. The dielectric layer has a recess extending from a top surface of the dielectric layer. The resin sealant layer is disposed over the top surface of the dielectric layer. The first semiconductor device is laterally confined by the recess of the dielectric layer and attached to a floor of the recess of the dielectric layer by an adhesive, with its contact pads facing the floor of the recess. The metal posts are disposed over the top surface of the dielectric layer and laterally covered by the resin sealant layer. The bottom buildup circuitry is disposed under a bottom surface of the core base and includes metallized vias extending through the dielectric layer and is electrically coupled to the active pads of the first semiconductor device and the metal posts. The second semiconductor device is disposed over a top surface of the core base and electrically coupled to the first semiconductor device through the metal posts and the bottom buildup circuitry.

The package-on-package semiconductor assemblies according to the present invention have numerous advantages. For instance, inserting the first semiconductor device into the recess of the dielectric layer can reduce the minimal required height of the metal posts by the amount equal to the depth of the recess of the dielectric layer. Forming the metal posts over the top surface of the dielectric layer can offer vertical routing to proceed with package-on-package interconnection procedure for the second semiconductor device disposed over the top surface of the core base and electrically coupled to the first semiconductor device through the bottom buildup circuitry.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENTS

Hereafter, examples will be provided to illustrate the embodiments of the present invention. Advantages and effects of the invention will become more apparent from the following description of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-28 are schematic views showing a method of making a package-on-package semiconductor assembly that includes a first semiconductor device, a core base, a top buildup circuitry, a bottom buildup circuitry and a second semiconductor device in accordance with the first embodiment of the present invention.

Figure 1:
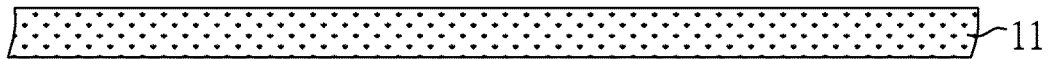
FIG. 1 is a cross-sectional view of a sacrificial carrier in accordance with the first embodiment of the present invention.

FIG. 1 is a cross-sectional view of a sacrificial carrier 11. The sacrificial carrier 11 can be made of any peelable or removable material, such as silicon, copper, aluminum, iron, nickel, tin or alloys thereof.

Figure 2:
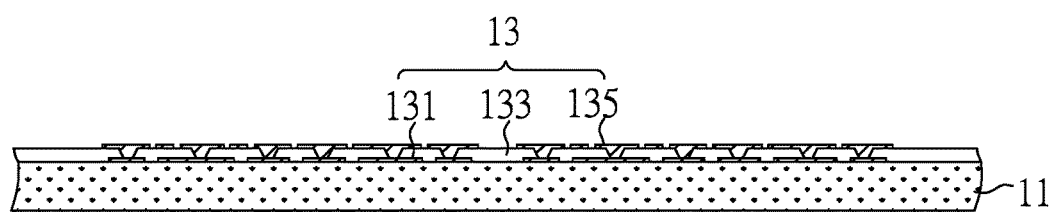
FIGS. 2 and 3 are cross-sectional and top perspective views, respectively, showing that a re-distribution layer is formed on the sacrificial carrier of FIG. 1 in accordance with the first embodiment of the present invention.
Figure 3:
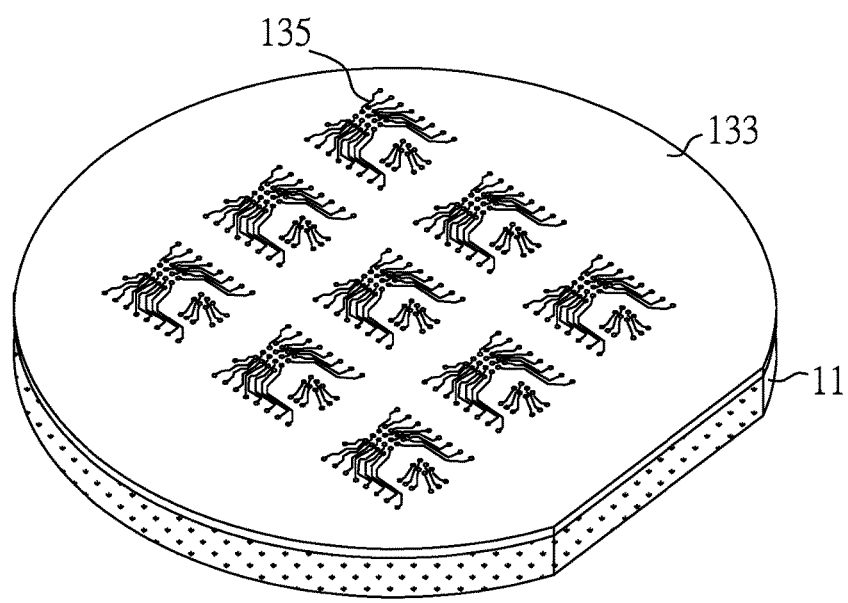

FIGS. 2 and 3 are cross-sectional and top perspective views, respectively, of the structure with a re-distribution layer 13 formed on the sacrificial carrier 11. In this illustration, the re-distribution layer 13 includes first routing traces 131, an insulating layer 133 and second routing traces 135. The first routing traces 131 extend laterally on the sacrificial carrier 11. The insulating layer 133 contacts and covers and extends laterally on the sacrificial carrier 11 and the first routing traces 131. The second routing traces 135 extend from the first routing traces 131 in the upward direction, extend through the insulating layer 133, and extend laterally on the insulating layer 133. The insulating layer 133 can be formed of epoxy resin, glass-epoxy, polyimide, and the like, and typically has a thickness of 50 microns.

Figure 4:
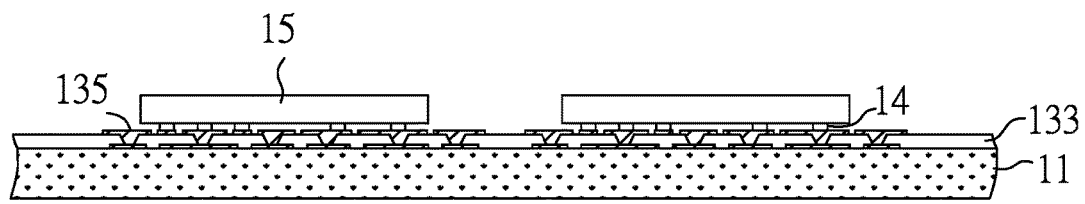
FIGS. 4 and 5 are cross-sectional and top perspective views, respectively, showing that semiconductor chips are mounted on the structure of FIGS. 2 and 3 in accordance with the first embodiment of the present invention.
Figure 5:
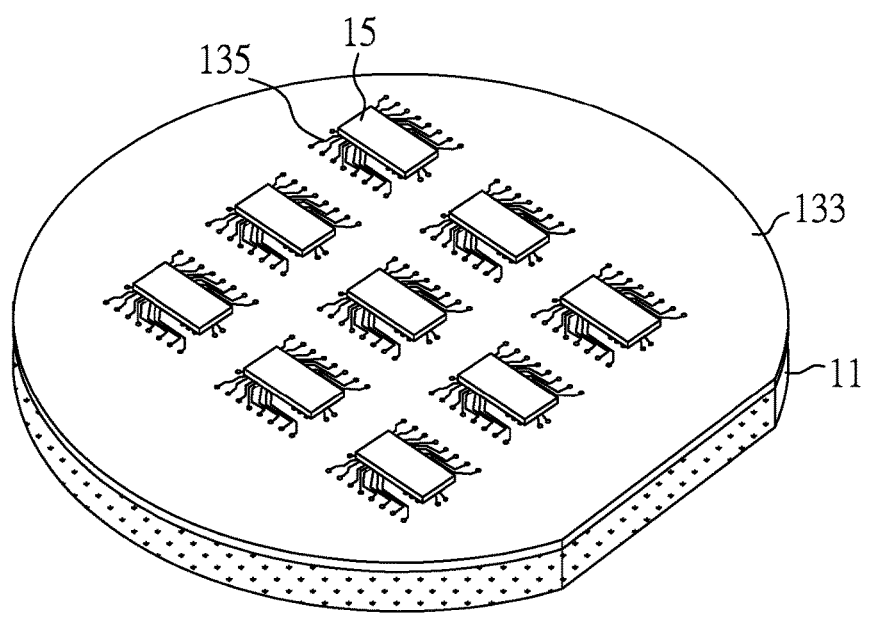

FIGS. 4 and 5 are cross-sectional and top perspective views, respectively, of the structure provided with semiconductor chips 15 flip-chip mounted on the re-distribution layer 13. The semiconductor chips 15 are electrically coupled to the second routing traces 135 using bumps 14 by thermal compression, solder reflow or thermosonic bonding.

Figure 6:
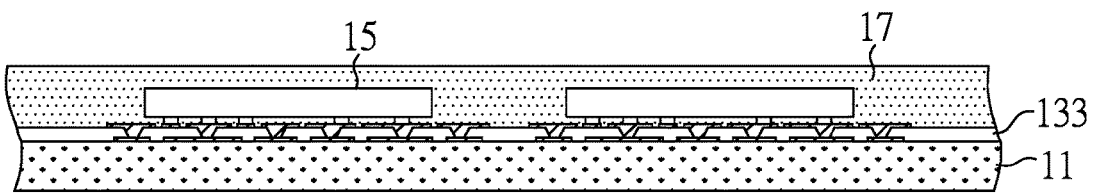
FIG. 6 is a cross-sectional view showing that the structure of FIG. 4 is provided with a mold compound in accordance with the first embodiment of the present invention.

FIG. 6 is a cross-sectional view of the structure provided with a mold compound 17 on the re-distribution layer 13 and the semiconductor chips 15. The mold compound 17 contacts and covers the re-distribution layer 13 and the semiconductor chips 15 from above typically by molding, resin coating and resin lamination.

Figure 7:
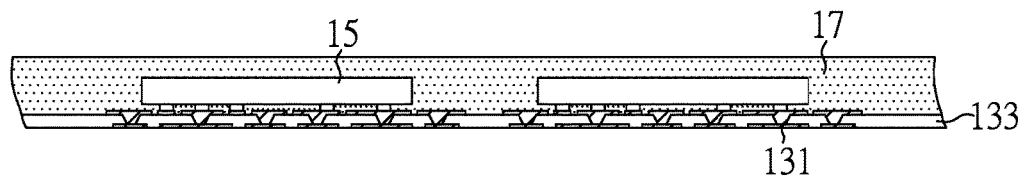
FIGS. 7 and 8 are cross-sectional and bottom perspective views, respectively, showing that the sacrificial carrier is removed from the structure of FIG. 6 in accordance with the first embodiment of the present invention.
Figure 8:
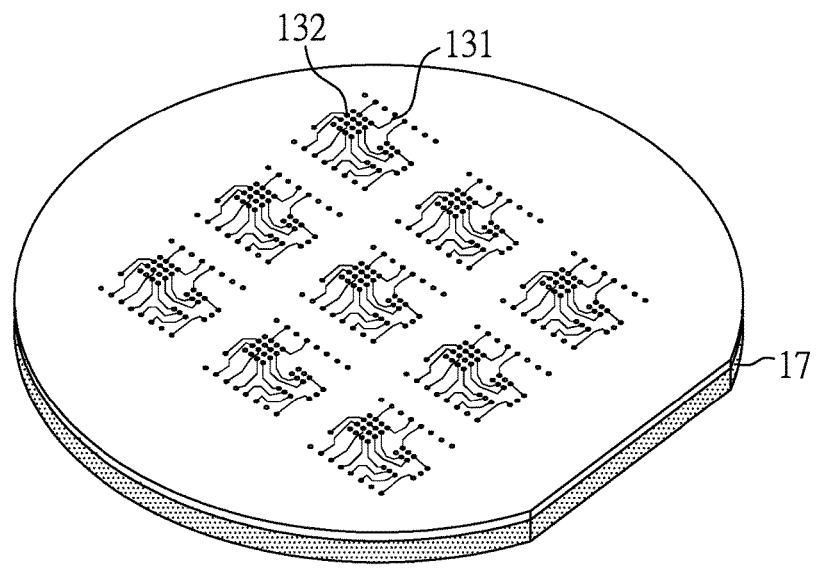

FIGS. 7 and 8 are cross-sectional and bottom perspective views, respectively, of the structure after removal of the sacrificial carrier 11. The sacrificial carrier 11 can be removed to expose the first routing traces 131 by numerous techniques, such as wet chemical etching using acidic solution (e.g., ferric chloride, copper sulfate solutions), or alkaline solution (e.g., ammonia solution), electro-chemical etching, or mechanical process such as a drill or end mill followed by chemical etching. As a result, the first routing traces 131 of the re-distribution layer 13 are exposed from below and have an array of active pads 132 (as shown in FIG. 8) to provide electrical contacts for the next level buildup circuitry interconnection.

Figure 9:
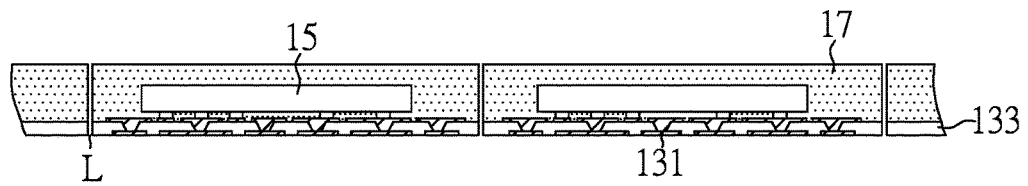
FIGS. 9 and 10 are cross-sectional and bottom perspective views, respectively, showing that the structure of FIGS. 7 and 8 is diced into individual pieces in accordance with the first embodiment of the present invention.
Figure 10:
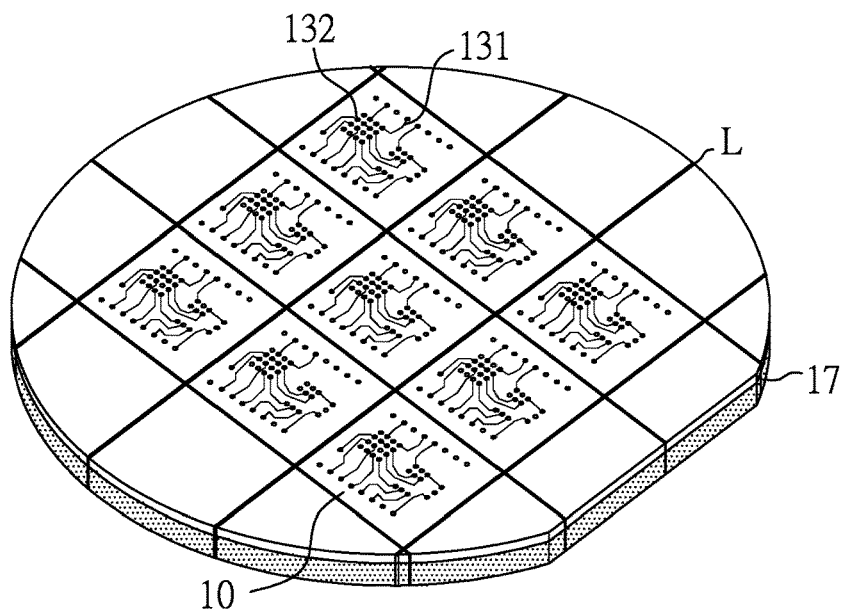

FIGS. 9 and 10 are cross-sectional and bottom perspective views, respectively, of the panel-scale structure of FIGS. 7 and 8 diced into individual pieces. The panel-scale structure, having the semiconductor chips 15 on the re-distribution layer 13, is singulated into individual first semiconductor devices 10 along dicing lines "L".

Figure 11:
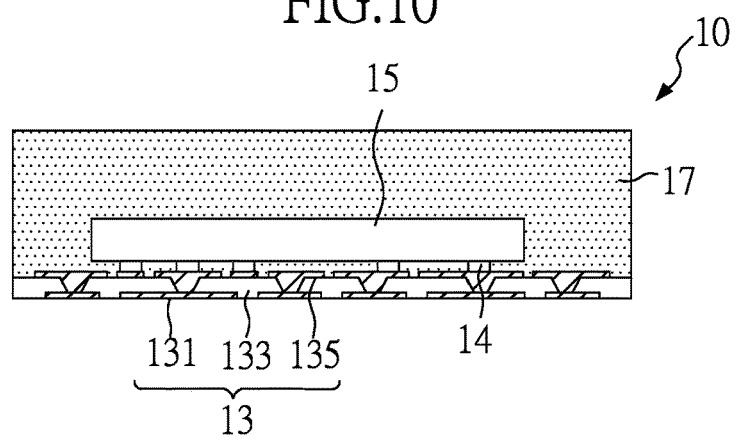
FIGS. 11 and 12 are cross-sectional and bottom perspective views, respectively, of a semiconductor device corresponding to a diced unit in FIGS. 9 and 10 in accordance with the first embodiment of the present invention.
Figure 12:
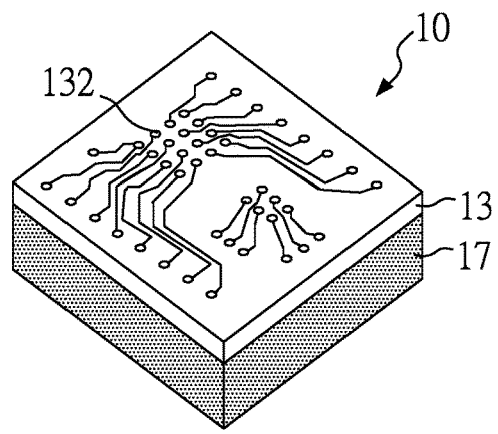

FIGS. 11 and 12 are cross-sectional and bottom perspective views, respectively, of an individual first semiconductor device 10 that includes a re-distribution layer 13, a semiconductor chip 15 and a mold compound 17. The re-distribution layer 13 has active pads 132 at its bottom surface, and the semiconductor chip 15 is electrically coupled to the re-distribution layer 13 from above and surrounded by the mold compound 17. In this illustration, the semiconductor chip 15 is electrically coupled to the re-distribution layer 13 using bumps 14. As an alternative, the first semiconductor device 10 may be fabricated by another method and includes the semiconductor chip 15 electrically coupled to the re-distribution layer 13 through micro-vias.

Figure 13:
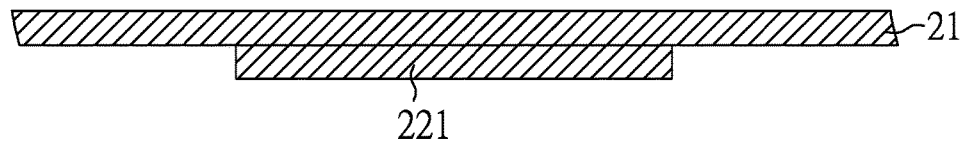
FIGS. 13 and 14 are cross-sectional and bottom perspective views, respectively, showing that a protruded metal platform is formed on a metal carrier in accordance with the first embodiment of the present invention.
Figure 14:
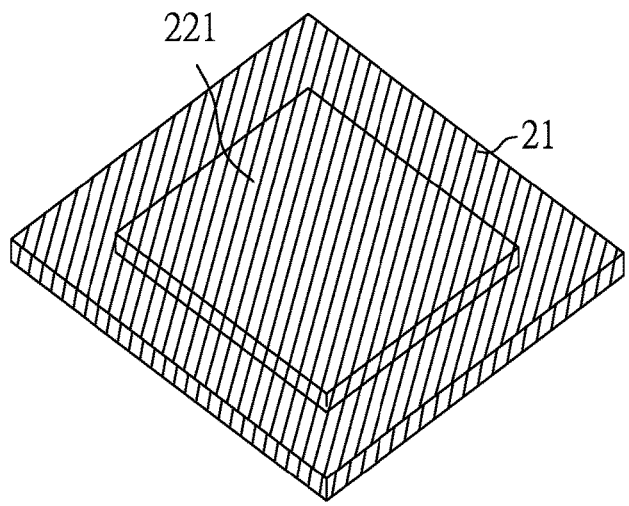

FIGS. 13 and 14 are cross-sectional and bottom perspective views, respectively, of the structure with a protruded metal platform 221 formed on a metal carrier 21. The metal carrier 21 and the protruded metal platform 221 typically are made of copper, aluminum, nickel or other metals or alloys. The material of the protruded metal platform 221 may be the same as or different from that of the metal carrier 21. The thickness of the metal carrier 21 can range from 0.05 to 0.5 mm (preferably from 0.1 to 0.2 mm), whereas the thickness of the protruded metal platform 221 can range from 10 to 100 microns. In this embodiment, the metal carrier 21 is made of copper and has a thickness of 0.125 mm, whereas the protruded metal platform 221 is made of copper and has thickness of 50 microns. The protruded metal platform 221 can be formed on the metal carrier 21 by pattern deposition, such as electroplating, electroless plating, evaporating, sputtering or their combinations, or by etching or mechanical carving.

Figure 15:
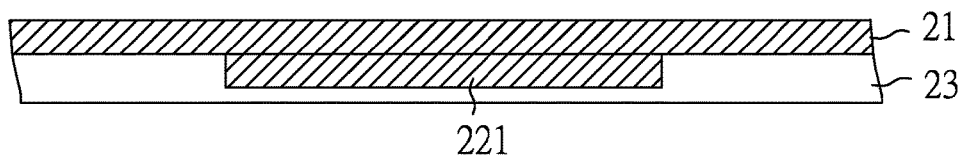
FIG. 15 is a cross-sectional view showing that the structure of FIG. 13 is provided with a first dielectric layer in accordance with the first embodiment of the present invention.

FIG. 15 is a cross-sectional view of the structure with a first dielectric layer 23 on the metal carrier 21 and the protruded metal platform 221. The first dielectric layer 23 can be deposited by lamination or coating, and typically contains glass fiber. The first dielectric layer 23 contacts and covers and extends laterally on the metal carrier 21 and the protruded metal platform 221 from below, and surrounds and conformally coats sidewalls of the protruded metal platform 221 in the lateral directions.

Figure 16:
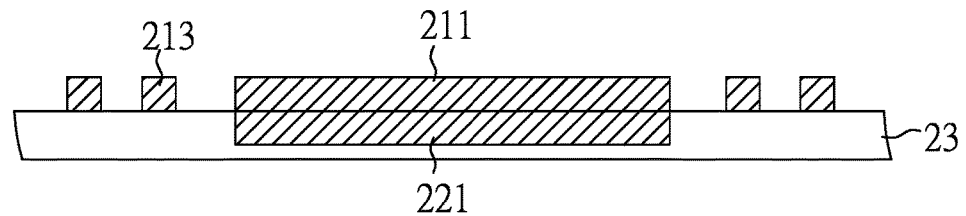
FIGS. 16 and 17 are cross-sectional and top perspective views, respectively, showing that a selected portion of the metal carrier is removed from the structure of FIG. 15 in accordance with the first embodiment of the present invention.
Figure 17:
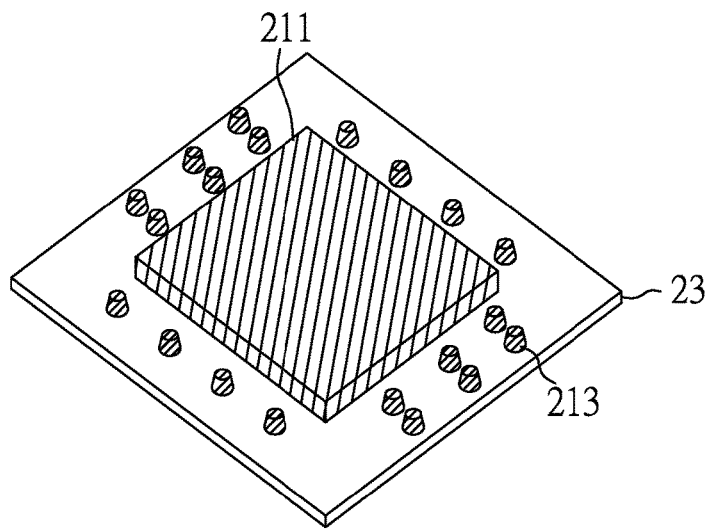

FIGS. 16 and 17 are cross-sectional and top perspective views, respectively, of the structure with a metal slug 211 and an array of metal posts 213 formed by removing a selected portion of the metal carrier 21 using, for example, photolithography and wet etching. The metal slug 211 covers the protruded metal platform 221 from above, and the metal posts 213 are located on the top surface of the first dielectric layer 23. At this stage, as the metal carrier 21 is etched and segregated into the metal slug 211 and the metal posts 213, the integrity of the entire structure is attributed to the mechanical strength of the first dielectric layer 23. Glass fiber contained in the first dielectric layer 23 can play an essential role in enhancing the mechanical strength of the first dielectric layer 23 to avoid resin cracking and warping.

Figure 18:
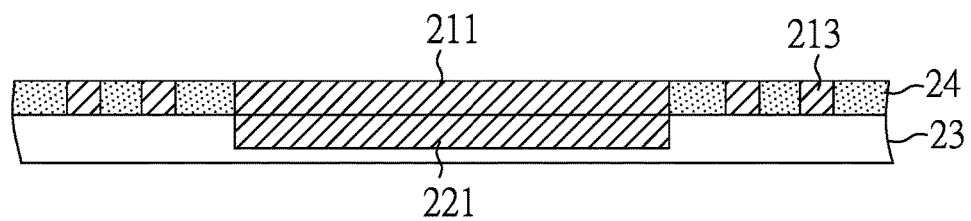
FIG. 18 is a cross-sectional view showing that the structure of FIG. 16 is provided with a resin sealant layer in accordance with the first embodiment of the present invention.

FIG. 18 is a cross-sectional view of the structure with a resin sealant layer 24 on the first dielectric layer 23. The resin sealant layer 24 covers the first dielectric layer 23 from above and surrounds and conformally coats and covers sidewalls of the metal slug 211 and the metal posts 213 in the lateral directions. The resin sealant layer 24 typically is five of glass fiber and has a thickness equal to that of the metal slug 211 and the metal posts 213. As a result, the resin sealant layer 24 is substantially coplanar with the metal slug 211 and the metal posts 213 at top and bottom surfaces thereof.

Figure 19:
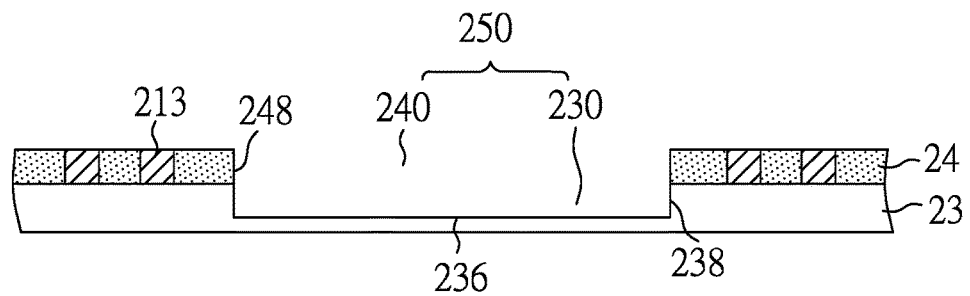
FIGS. 19 and 20 are cross-sectional and top perspective views, respectively, showing that the structure of FIG. 18 is provided with a placement area in accordance with the first embodiment of the present invention.
Figure 20:
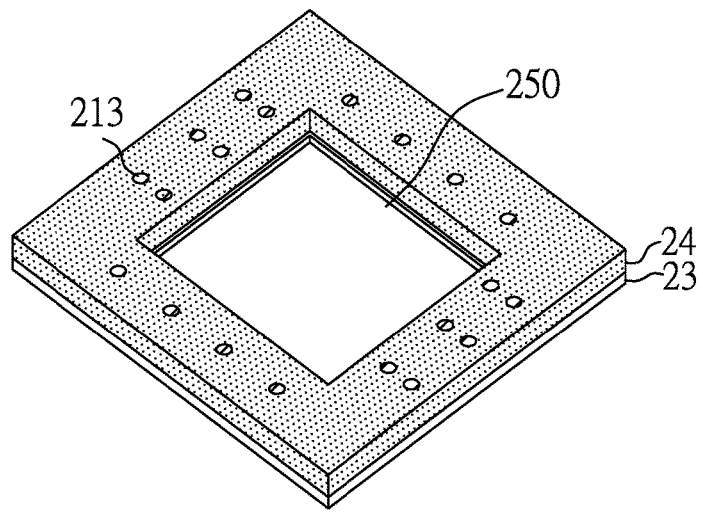

FIGS. 19 and 20 are cross-sectional and top perspective views, respectively, of the structure after removal of the metal slug 211 and the protruded metal platform 221. The metal slug 211 and the protruded metal platform 221 can be removed by numerous techniques, such as wet chemical etching, electro-chemical etching or laser. As a result, a placement area 250 is formed and consists of a recess 230 and an aperture 240. The recess 230 in the first dielectric layer 23 has a floor 236 that is substantially parallel to the top and bottom surfaces of the first dielectric layer 23 and a periphery defining interior sidewalls 238 that extend from the floor 236 to the top surface of the first dielectric layer 23. The aperture 240 has sidewalls 248 that extend from the bottom surface to the top surface of the resin sealant layer 24 and is aligned with the recess 230. In this illustration, the recess 230 and the aperture 240 have the same diameter, and the sidewalls 248 of the aperture 240 are flush with the sidewalls 238 of the recess 230.

Figure 21:
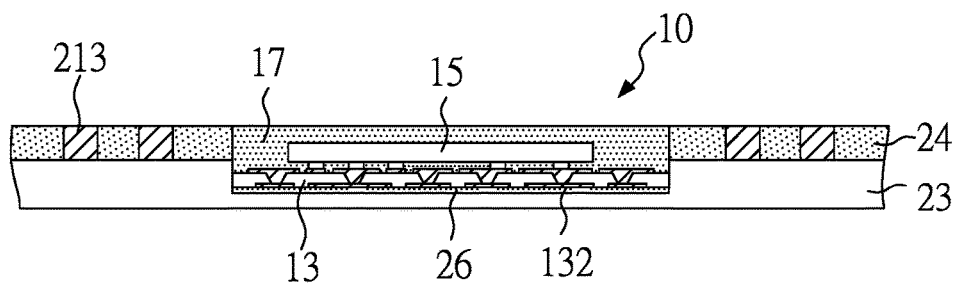
FIG. 21 is a cross-sectional view showing that the structure of FIG. 19 is provided with the semiconductor device of FIG. 11 in accordance with the first embodiment of the present invention.

FIG. 21 is a cross-sectional view of the structure with the first semiconductor device 10 of FIG. 11 placed in the placement area 250. The first semiconductor device 10 is inserted into the placement area 250 and attached to the floor 236 of the recess 230 by an adhesive 26, with the active pads 132 in contact with the adhesive 26 and the mold compound 17 substantially coplanar with the metal posts 213 and the resin sealant layer 24 at top surfaces thereof. The adhesive 26 contacts and is sandwiched between the re-distribution layer 13 of the first semiconductor device 10 and the floor 236 of the recess 230 to provide mechanical bonds between the first semiconductor device 10 and the first dielectric layer 23. The sidewalls 238 of the recess 230 and the sidewalls 248 of the aperture 240 are laterally aligned with and in close proximity to peripheral edges of the first semiconductor device 10 and confine the dislocation of the first semiconductor device 10 laterally.

Figure 22:
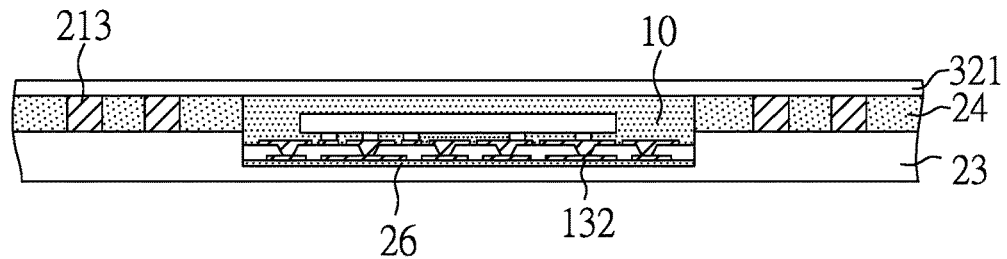
FIG. 22 is a cross-sectional view showing that the structure of FIG. 21 is provided with a second dielectric layer in accordance with the first embodiment of the present invention.

FIG. 22 is a cross-sectional view of the structure with a second dielectric layer 321 laminated/coated on the first semiconductor device 10, the metal posts 213 and the resin sealant layer 24 from above. The second dielectric layer 321 contacts and covers and extends laterally on the top surfaces of the first semiconductor device 10, the metal posts 213 and the resin sealant layer 24. In this embodiment, the second dielectric layer 321 typically has a thickness of 50 microns and can be made of epoxy resin, glass-epoxy, polyimide, and the like.

Figure 23:
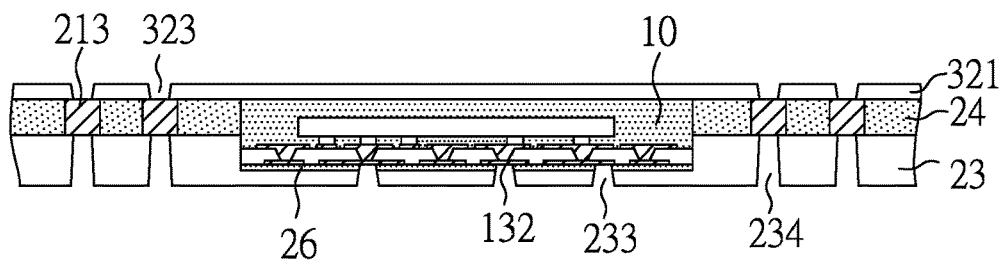
FIG. 23 is a cross-sectional view showing that the structure of FIG. 22 is provided with first and second via openings in accordance with the first embodiment of the present invention.

FIG. 23 is a cross-sectional view of the structure provided with first via openings 233, 234 and second via openings 323. The first via openings 233 extend through the first dielectric layer 23 and the adhesive 26 and are aligned with and expose active pads 132 of the first semiconductor device 10 in the downward direction, whereas the first via openings 234 extend through the first dielectric layer 23 and are aligned with and expose selected portions of the metal posts 213 in the downward direction. The second via openings 323 extend through the second dielectric layer 321 and are aligned with and expose selected portions of the metal posts 213 in the upward direction. The first via openings 233, 234 and the second via openings 323 may be formed by numerous techniques, such as laser drilling, plasma etching and photolithography, and typically have a diameter of 50 microns. Laser drilling can be enhanced by a pulsed laser. Alternatively, a scanning laser beam with a metal mask can be used. For instance, copper can be etched first to create a metal window followed by laser.

Figure 24:
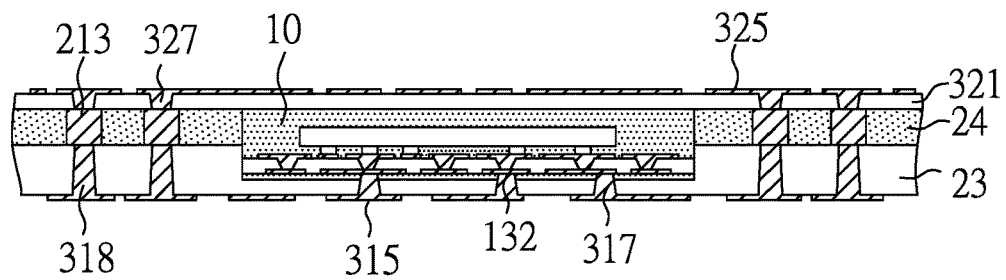
FIG. 24 is a cross-sectional view showing that the structure of FIG. 23 is provided with first and second conductive traces in accordance with the first embodiment of the present invention.

Referring now to FIG. 24, first conductive traces 315 and second conductive traces 325 are respectively formed on the first dielectric layer 23 and the second dielectric layer 321 by metal deposition and metal patterning process. The first conductive traces 315 extend from the bottom surface of the metal posts 213 and the active pads 132 of the first semiconductor device 10 in the downward direction, fill up the first via openings 233, 234 to form first metallized vias 317, 318 in direct contact with the active pads 132 of the first semiconductor device 10 and the metal posts 213, respectively, and extend laterally on the first dielectric layer 23. The second conductive traces 325 extend from the top surface of the metal posts 213 in the upward direction, fill up the second via openings 323 to form second metallized vias 327 in direct contact with the metal posts 213, and extend laterally on the second dielectric layer 321. As a result, the first conductive traces 315 and the second conductive traces 325 can provide horizontal signal routing in both the X and Y directions and vertical routing through the first via openings 233, 234 and the second via openings 323 and serve as electrical connections for the first semiconductor device 10 and the metal posts 213.

The first conductive traces 315 and the second conductive traces 325 can be deposited as a single layer or multiple layers by any of numerous techniques, such as electroplating, electroless plating, evaporating, sputtering, or their combinations. For instance, they can be deposited by first dipping the structure in an activator solution to render the first dielectric layer 23 and the second dielectric layer 321 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the first conductive traces 315 and the second conductive traces 325 by any of numerous techniques, such as wet etching, electro-chemical etching, laser-assist etching, and their combinations, with an etch mask (not shown) thereon that defines the first conductive traces 315 and the second conductive traces 325.

Figure 25:
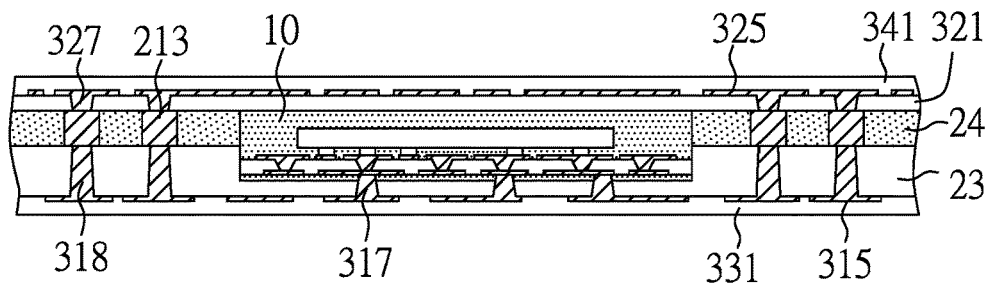
FIG. 25 is a cross-sectional view showing that the structure of FIG. 24 is provided with third and fourth dielectric layers in accordance with the first embodiment of the present invention.

FIG. 25 is a cross-sectional view of the structure with a third dielectric layer 331 laminated/coated on the first dielectric layer 23 and the first conductive traces 315 from below, and a fourth dielectric layer 341 laminated/coated on the second dielectric layer 321 and the second conductive traces 325 from above. The third dielectric layer 331 contacts and covers and extends laterally on the first dielectric layer 23 and the first conductive traces 315 from below. The fourth dielectric layer 341 contacts and covers and extends laterally on the second dielectric layer 321 and the second conductive traces 325 from above. The third dielectric layer 331 and the fourth dielectric layer 341 can be formed of epoxy resin, glass-epoxy, polyimide, and the like, and typically has a thickness of 50 microns.

Figure 26:
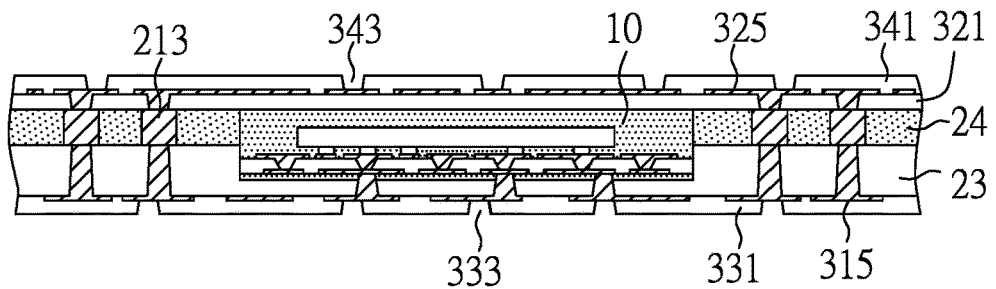
FIG. 26 is a cross-sectional view showing that the structure of FIG. 25 is provided with third and fourth via openings in accordance with the first embodiment of the present invention.

FIG. 26 is a cross-sectional view of the structure provided with third via openings 333 and fourth via openings 343. The third via openings 333 extend through the third dielectric layer 331 to expose selected portions of the first conductive traces 315 in the downward direction. The fourth via openings 343 extend through the fourth dielectric layer 341 to expose selected portions of the second conductive traces 325 in the upward direction. Like the first via openings 233, 234 and the second via openings 323, the third via openings 333 and the fourth via openings 343 can be formed by any of numerous techniques, such as laser drilling, plasma etching and photolithography and typically have a diameter of 50 microns.

Figure 27:
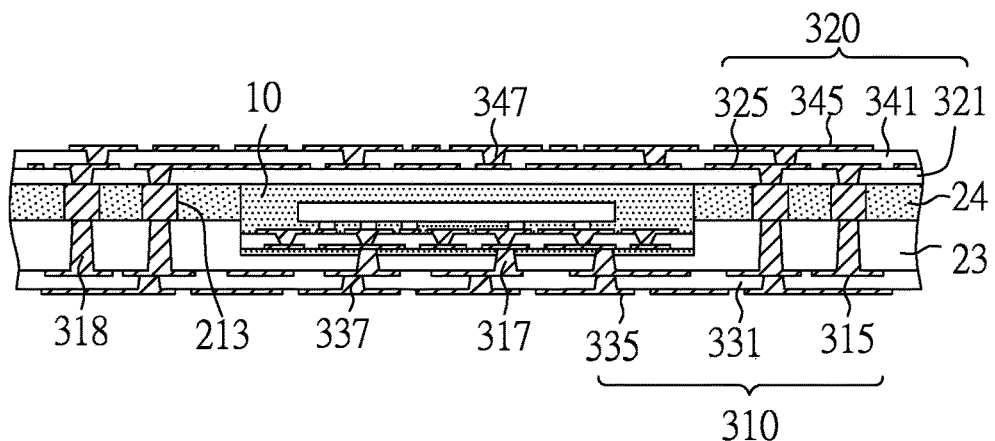
FIG. 27 is a cross-sectional view showing that the structure of FIG. 26 is provided with third and fourth conductive traces in accordance with the first embodiment of the present invention.

FIG. 27 is a cross-sectional view of the structure provided with third conductive traces 335 and fourth conductive traces 345 on the third dielectric layer 331 and the fourth dielectric layer 341 by metal deposition and metal patterning process, respectively. The third conductive traces 335 extend from the first conductive traces 315 in the downward direction, fill up the third via openings 333 to form third metallized vias 337 in direct contact with the first conductive traces 315, and extend laterally on the third dielectric layer 331. The fourth conductive traces 345 extend from the second conductive traces 325 in the upward direction, fill up the fourth via openings 343 to form fourth metallized vias 347 in direct contact with the second conductive traces 325, and extend laterally on the fourth dielectric layer 341.

At this stage, a bottom buildup circuitry 310 and a top buildup circuitry 320 are accomplished, and the top buildup circuitry 320 is electrically coupled to the bottom buildup circuitry 310 through the metal posts 213.

Figure 28:
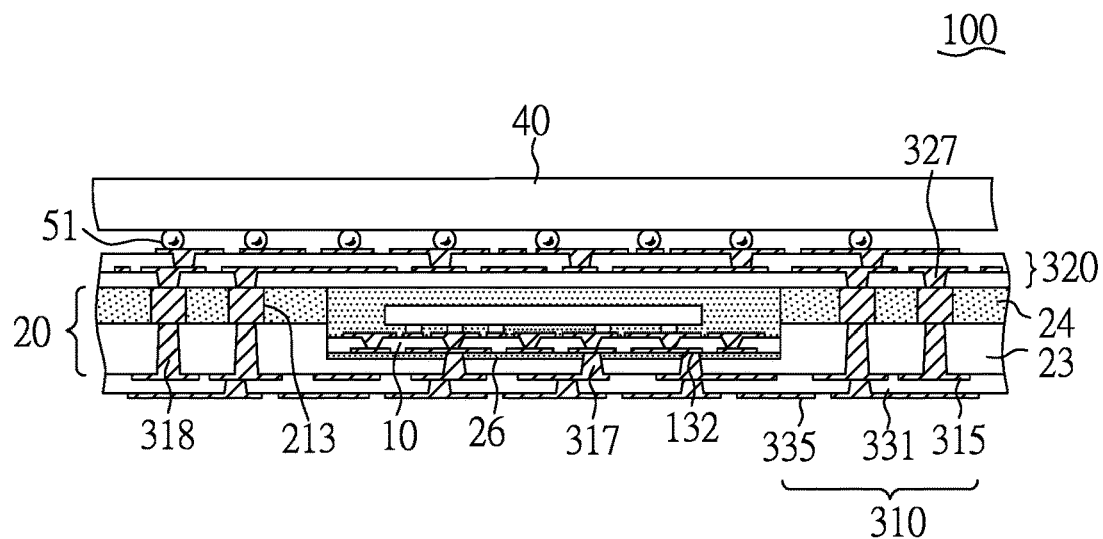
FIG. 28 is a cross-sectional view showing that another semiconductor device is mounted on the structure of FIG. 27 to finish the fabrication of a package-on-package semiconductor assembly in accordance with the first embodiment of the present invention.

FIG. 28 is a cross-sectional view of the structure provided with a second semiconductor device 40 mounted on the fourth conductive traces 345. The second semiconductor device 40 is mounted on the top buildup circuitry 320 via solder balls 51 in contact with the fourth conductive traces 345 and the second semiconductor device 40.

Accordingly, as shown in FIG. 28, a package-on-package semiconductor assembly 100 is accomplished and includes a first semiconductor device 10, a core base 20, a bottom buildup circuitry 310, a top buildup circuitry 320, and a second semiconductor device 40. In this illustration, the first semiconductor device 10 includes a re-distribution layer 13, a semiconductor chip 15 and a mold compound 17; the core base 20 includes an array of metal posts 213, a first dielectric layer 23 and a resin sealant layer 24; the bottom buildup circuitry 310 includes first conductive traces 315, a third dielectric layer 331 and third conductive traces 335; and the top buildup circuitry 320 includes a second dielectric layer 321, second conductive traces 325, a fourth dielectric layer 341 and fourth conductive traces 345.

The first semiconductor device 10 is face-down disposed in a recess 230 of the first dielectric layer 23 and protrudes out from the recess 230 and extends through an aperture 240 of the resin sealant layer 24, with its mold compound 17 being substantially coplanar with the metal posts 213 and the resin sealant layer 24 at the top surfaces thereof. The gap between the first semiconductor device 10 and the sidewalls 238, 248 of the recess 230 and the aperture 240 ranges from 5 to 50 microns. As such, the placement accuracy of the first semiconductor device 10 can be provided by the sidewalls 238 of the recess 230 and the sidewalls 248 of the aperture 240, with the sidewalls 238 of the recess 230 extending beyond the bottom surface of the first semiconductor device 10 in the upward direction. The bottom buildup circuitry 310 is disposed on the bottom surface of the core base 20 and is electrically coupled to the active pads 132 of the first semiconductor device 10 through its first metallized vias 317 that extend through the adhesive 26 and the first dielectric layer 23 and is further electrically coupled to the metal posts 213 of the core base 20 through its additional first metallized vias 318 that extend through the first dielectric layer 23. The top buildup circuitry 320 is disposed on the top surfaces of the first semiconductor device 10 and the core base 20 and is electrically coupled to the metal posts 213 of the core base 20 through its second metallized vias 327. The second semiconductor device 40 is disposed over the top buildup circuitry 320 and electrically coupled to the first semiconductor device 10 through the top buildup circuitry 320, the metal posts 213 and the bottom buildup circuitry 310.

Embodiment 2

FIGS. 29-40 are schematic views showing a method of making a package-on-package semiconductor assembly with auxiliary metal pads underneath the metal posts in accordance with the second embodiment of the present invention.

For purposes of brevity, any description in Embodiment 1 above is incorporated herein insofar as the same is applicable, and the same description need not be repeated.

Figure 29:
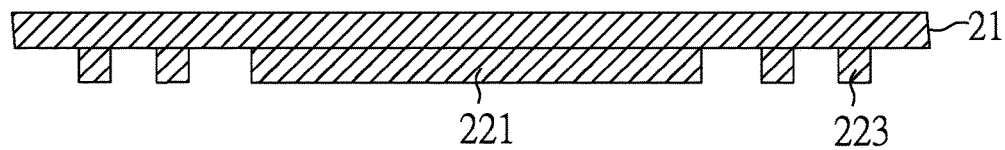
FIG. 29 is a cross-sectional view showing that a protruded metal platform and auxiliary metal pads are formed on a metal carrier in accordance with the second embodiment of the present invention.

FIG. 29 is a cross-sectional view of the structure with a protruded metal platform 221 and an array of auxiliary metal pads 223 formed on a metal carrier 21. The protruded metal platform 221 and the auxiliary metal pads 223 extend from the bottom surface of the metal carrier 21 in the downward direction. In this illustration, the auxiliary metal pads 223 are substantially coplanar with the protruded metal platform 221 at their top and bottom surfaces. The auxiliary metal pads 223 can be made of the same material as the protruded metal platform 221, and may be formed by pattern deposition, such as electroplating, electroless plating, evaporating, sputtering or their combinations, or by etching or mechanical carving.

Figure 30:
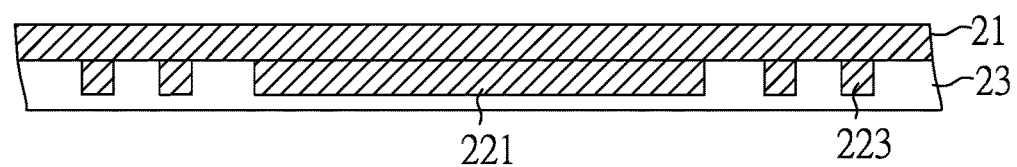
FIG. 30 is a cross-sectional view showing that the structure of FIG. 29 is provided with a first dielectric layer in accordance with the second embodiment of the present invention.

FIG. 30 is a cross-sectional view of the structure with a first dielectric layer 23 on the metal carrier 21, the protruded metal platform 221 and the auxiliary metal pads 223. The first dielectric layer 23 contacts and covers the metal carrier 21, the protruded metal platform 221 and the auxiliary metal pads 223 from below, and surrounds and conformally coats sidewalls of the protruded metal platform 221 and the auxiliary metal pads 223 in the lateral directions.

Figure 31:
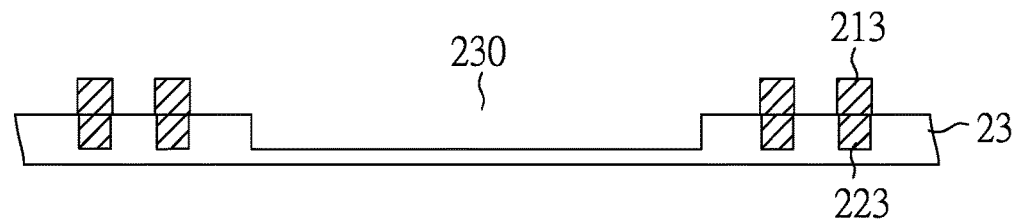
FIG. 31 is a cross-sectional view showing that the structure of FIG. 30 is formed with a recess and metal posts in accordance with the second embodiment of the present invention.

FIG. 31 is a cross-sectional view of the structure with a recess 230 and an array of metal posts 213 formed by removing a selected portion of the metal carrier 21 and the protruded metal platform 221. The metal posts 213 are aligned with and contact and cover the auxiliary metal pads 223 in the upward direction. The diameter of the metal post 213 at its bottom surface may be the same as or different from that of the auxiliary metal pad 223 at its top surface. Further, the recess 230 has a depth substantially equal to the thickness of the auxiliary metal pads 223.

Figure 32:
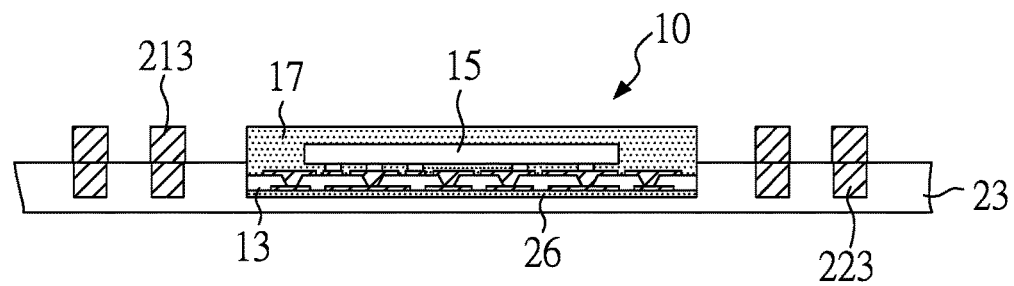
FIG. 32 is a cross-sectional view showing that the structure of FIG. 31 is provided with the semiconductor device of FIG. 11 in accordance with the second embodiment of the present invention.

FIG. 32 is a cross-sectional view of the structure with the first semiconductor device 10 of FIG. 11 placed in the recess 230 of the first dielectric layer 23. The first semiconductor device 10 is inserted into the recess 230 and attached to the first dielectric layer 23 by an adhesive 26, with the re-distribution layer 13 in contact with the adhesive 26 and the mold compound 17 substantially coplanar with the metal posts 213 at top surfaces thereof.

Figure 33:
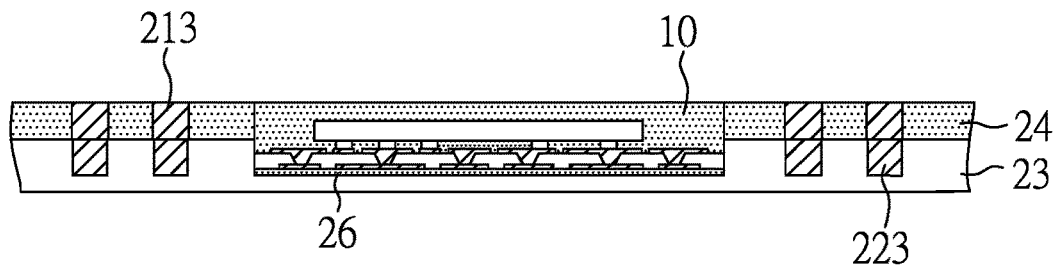
FIG. 33 is a cross-sectional view showing that the structure of FIG. 32 is provided with a resin sealant layer in accordance with the second embodiment of the present invention.

FIG. 33 is a cross-sectional view of the structure with a resin sealant layer 24 on the first dielectric layer 23. The resin sealant layer 24 covers the first dielectric layer 23 from above and surrounds and conformally coats and covers sidewalls of the first semiconductor device 10 and the metal posts 213 in the lateral directions. The resin sealant layer 24 is substantially coplanar with the first semiconductor device 10 and the metal posts 213 at top surfaces thereof.

Figure 34:
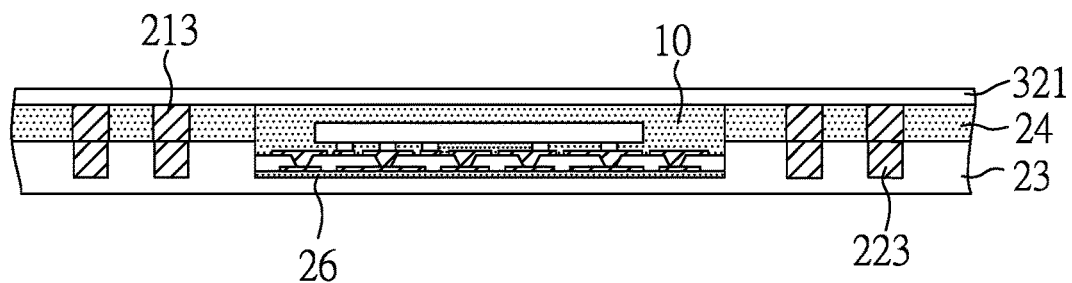
FIG. 34 is a cross-sectional view showing that the structure of FIG. 33 is provided with a second dielectric layer in accordance with the second embodiment of the present invention.

FIG. 34 is a cross-sectional view of the structure with a second dielectric layer 321 laminated/coated on the first semiconductor device 10, the metal posts 213 and the resin sealant layer 24 from above. The second dielectric layer 321 contacts and covers the top surfaces of first semiconductor device 10, the metal posts 213 and the resin sealant layer 24.

Figure 35:
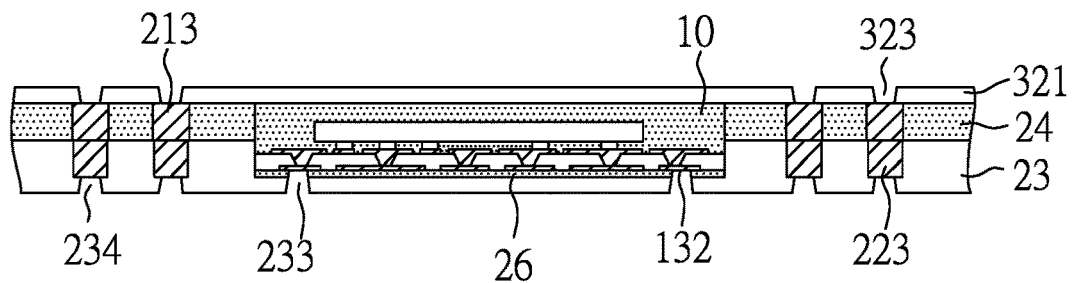
FIG. 35 is a cross-sectional view showing that the structure of FIG. 34 is provided with first and second via openings in accordance with the second embodiment of the present invention.

FIG. 35 is a cross-sectional view of the structure provided with first via openings 233, 234 and second via openings 323. The first via openings 233 extend through the first dielectric layer 23 and the adhesive 26 and are aligned with and expose the active pads 132 of the first semiconductor device 10 in the downward direction, whereas the first via openings 234 extend through the first dielectric layer 23 and are aligned with and expose selected portions of the auxiliary metal pads 223 in the downward direction. The second via openings 323 extend through the second dielectric layer 321 and are aligned with and expose selected portions of the metal posts 213 in the upward direction.

Figure 36:
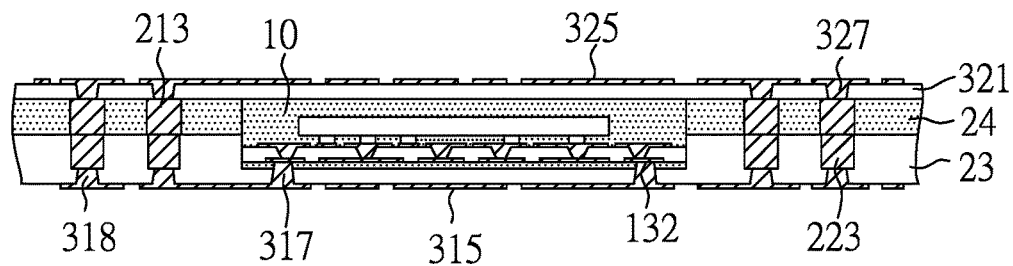
FIG. 36 is a cross-sectional view showing that the structure of FIG. 35 is provided with first and second conductive traces in accordance with the second embodiment of the present invention.

Referring now to FIG. 36, first conductive traces 315 and second conductive traces 325 are respectively formed on the first dielectric layer 23 and the second dielectric layer 321 by metal deposition and metal patterning process. The first conductive traces 315 extend from the active pads 132 and the auxiliary metal pads 223 in the downward direction, fill up the first via openings 233, 234 to form first metallized vias 317, 318, and extend laterally on the first dielectric layer 23. The second conductive traces 325 extend from the metal posts 213 in the upward direction, fill up the second via openings 323 to form second metallized vias 327, and extend laterally on the second dielectric layer 321.

Figure 37:
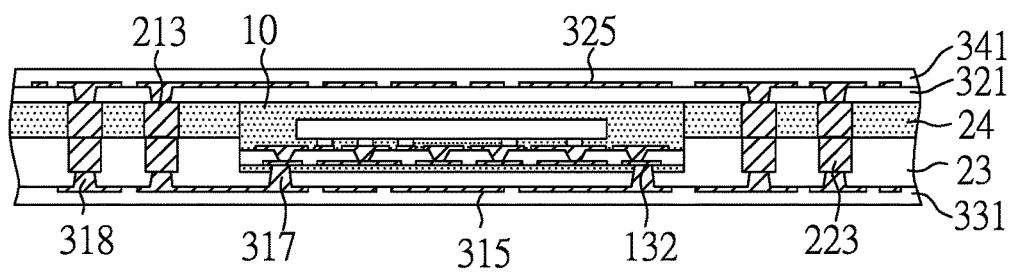
FIG. 37 is a cross-sectional view showing that the structure of FIG. 36 is provided with third and fourth dielectric layers in accordance with the second embodiment of the present invention.

FIG. 37 is a cross-sectional view of the structure with a third dielectric layer 331 laminated/coated on the first dielectric layer 23 and the first conductive traces 315 from below, and a fourth dielectric layer 341 laminated/coated on the second dielectric layer 321 and the second conductive traces 325 from above. The third dielectric layer 331 contacts and covers and extends laterally on the first dielectric layer 23 and the first conductive traces 315 from below. The fourth dielectric layer 341 contacts and covers and extends laterally on the second dielectric layer 321 and the second conductive traces 325 from above.

Figure 38:
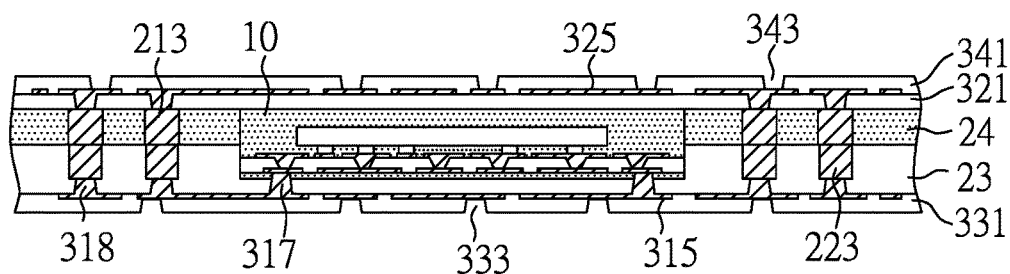
FIG. 38 is a cross-sectional view showing that the structure of FIG. 37 is provided with third and fourth via openings in accordance with the second embodiment of the present invention.

FIG. 38 is a cross-sectional view of the structure provided with third via openings 333 and fourth via openings 343. The third via openings 333 extend through the third dielectric layer 331 to expose selected portions of the first conductive traces 315 in the downward direction. The fourth via openings 343 extend through the fourth dielectric layer 341 to expose selected portions of the second conductive traces 325 in the upward direction.

Figure 39:
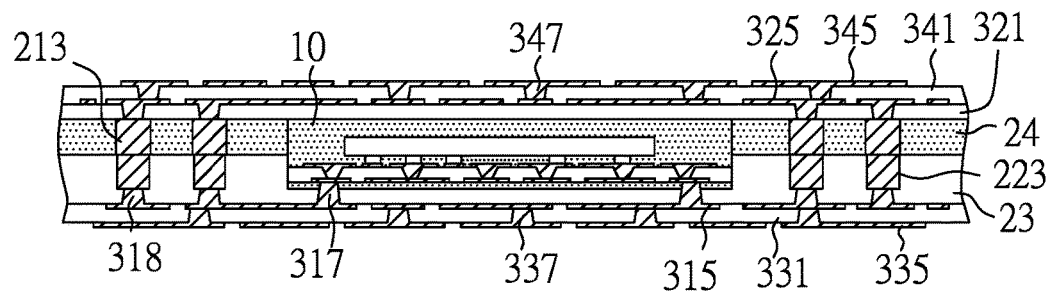
FIG. 39 is a cross-sectional view showing that the structure of FIG. 38 is provided with third and fourth conductive traces in accordance with the second embodiment of the present invention.

FIG. 39 is a cross-sectional view of the structure provided with third conductive traces 335 on the third dielectric layer 331 and fourth conductive traces 345 on the fourth dielectric layer 341 by metal deposition and metal patterning process. The third conductive traces 335 extend from the first conductive traces 315 in the downward direction, fill up the third via openings 333 to form third metallized vias 337 in direct contact with the first conductive traces 315, and extend laterally on the third dielectric layer 331. The fourth conductive traces 345 extend from the second conductive traces 325 in the upward direction, fill up the fourth via openings 343 to form fourth metallized vias 347 in direct contact with the second conductive traces 325, and extend laterally on the fourth dielectric layer 341.

Figure 40:
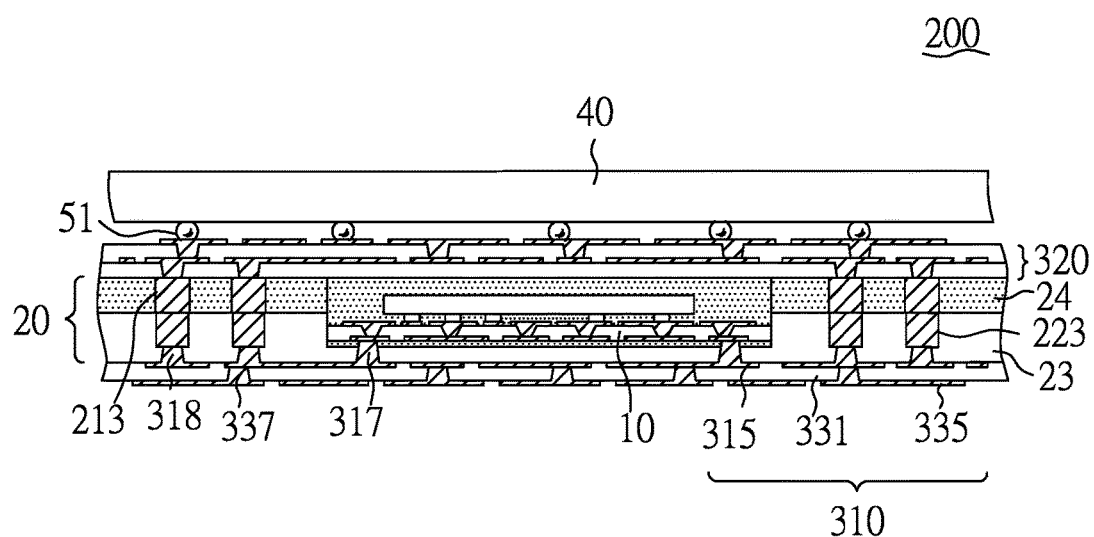
FIG. 40 is a cross-sectional view showing that another semiconductor device is mounted on the structure of FIG. 39 to finish the fabrication of a package-on-package semiconductor assembly in accordance with the second embodiment of the present invention.

FIG. 40 is a cross-sectional view of the structure provided with a second semiconductor device 40 mounted on the fourth conductive traces 345. The second semiconductor device 40 is electrically coupled to the first semiconductor device 10 via solder balls 51 in contact with the fourth conductive traces 345 and the second semiconductor device 40.

Accordingly, as shown in FIG. 40, a package-on-package semiconductor assembly 200 is accomplished and includes a first semiconductor device 10, a core base 20, a bottom buildup circuitry 310, a top buildup circuitry 320 and a second semiconductor device 40. In this illustration, the first semiconductor device 10 includes a re-distribution layer 13, a semiconductor chip 15 and a mold compound 17; the core base 20 includes an array of metal posts 213, an array of auxiliary metal pads 223, a first dielectric layer 23 and a resin sealant layer 24; the bottom buildup circuitry 310 includes first conductive traces 315, a third dielectric layer 331 and third conductive traces 335; and the top buildup circuitry 320 includes a second dielectric layer 321, second conductive traces 325, a fourth dielectric layer 341 and fourth conductive traces 345.

The first semiconductor device 10 extends through an aperture 240 of the resin sealant layer 24 and into a recess 230 of the first dielectric layer 23. The protrusion height of the first semiconductor device 10 out of the recess 230 is substantially equal to the thickness of the metal posts 213 and the resin sealant layer 24, whereas the depth of the recess 230 is substantially equal to the thickness of the auxiliary metal pads 223. The bottom buildup circuitry 310 is electrically coupled to the active pads 132 of the first semiconductor device 10 and the metal posts 213 and provides a fan-out routing for the first semiconductor device 10. The top buildup circuitry 320 is electrically coupled to the bottom buildup circuitry 310 through the metal posts 213 and the auxiliary metal pads 223 of the core base 20, and provides electrical contacts for the second semiconductor device 40.

Embodiment 3

FIGS. 41-48 are schematic views showing a method of making a package-on-package semiconductor assembly in which the first semiconductor device 10 includes protruded bumps 18 extending through the first dielectric layer 23 in accordance with the third embodiment of the present invention.

For purposes of brevity, any description in aforementioned Embodiments above is incorporated herein insofar as the same is applicable, and the same description need not be repeated.

Figure 41:
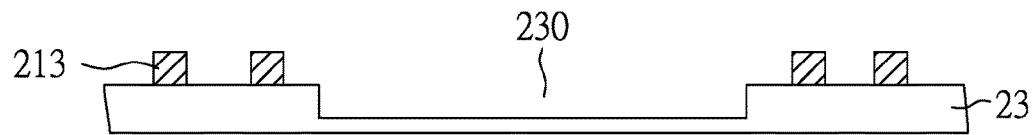
FIG. 41 is a cross-sectional view showing that metal posts are formed on a first dielectric layer in accordance with the third embodiment of the present invention.

FIG. 41 is a cross-sectional view of the structure with an array of metal posts 213 on a first dielectric layer 23. This structure can be fabricated by removing selected portions of the metal carrier 21 and the protruded metal platform 221 illustrated in FIG. 13. As a result, the first dielectric layer 23 has a recess 230 that extends from a top surface thereof, and the metal posts 213 are positioned beyond the recess 230.

Figure 42:
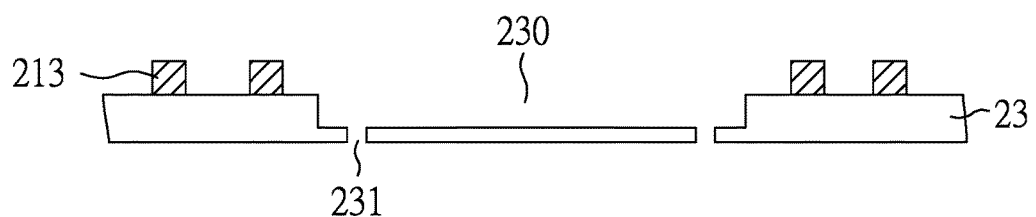
FIG. 42 is a cross-sectional view showing that the structure of FIG. 41 is provided with through-holes in accordance with the third embodiment of the present invention.

FIG. 42 is a cross-sectional view of the structure provided with an array of through-holes 231 in the first dielectric layer 23. The through-holes 231 are aligned with the recess 230 and extend through the first dielectric layer 23.

Figure 43:
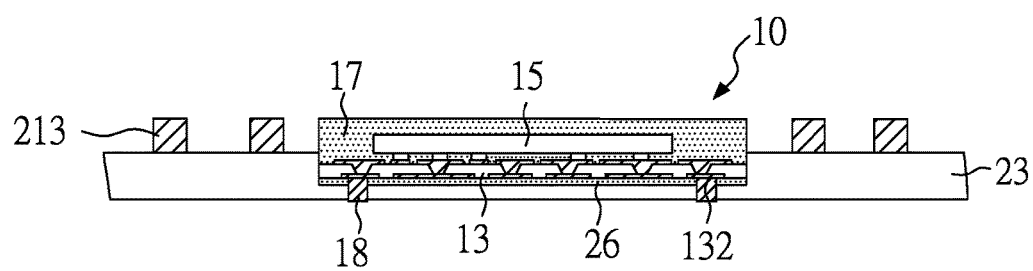
FIG. 43 is a cross-sectional view showing that the structure of FIG. 42 is provided with the semiconductor device of FIG. 11 in accordance with the third embodiment of the present invention.

FIG. 43 is a cross-sectional view of the structure with a first semiconductor device 10 placed in the recess 230 of the first dielectric layer 23. In this embodiment, the first semiconductor device 10 is similar to that illustrated in FIG. 11, except that the first semiconductor device 10 further includes protruded bumps 18 on the active pads 132 of the re-distribution layer 13. The protruded bumps 18 can be copper, solder or gold pillars or other conductive bumps. The first semiconductor device 10 is attached to the first dielectric layer 23 at the recess 230 by an adhesive 26, with the protruded bumps 18 being inserted into and exposed from the through-holes 231 and the mold compound 17 being substantially coplanar with the metal posts 213 at top surfaces thereof.

Figure 44:
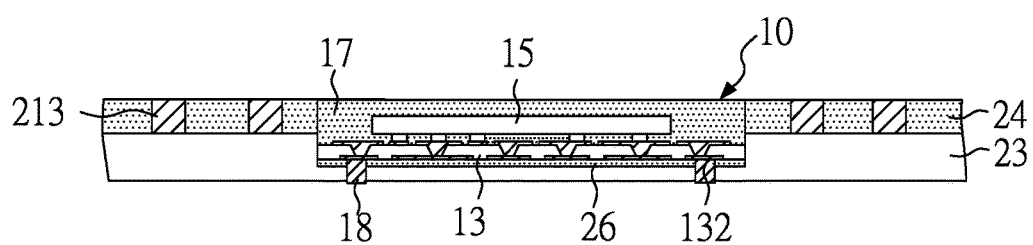
FIG. 44 is a cross-sectional view showing that the structure of FIG. 43 is provided with a resin sealant layer in accordance with the third embodiment of the present invention.

FIG. 44 is a cross-sectional view of the structure with a resin sealant layer 24 on the first dielectric layer 23. The resin sealant layer 24 covers the first dielectric layer 23 from above and surrounds and conformally coats and covers sidewalls of the first semiconductor device 10 and the metal posts 213 in the lateral directions. The resin sealant layer 24 is substantially coplanar with the first semiconductor device 10 and the metal posts 213 at top surfaces thereof.

Figure 45:
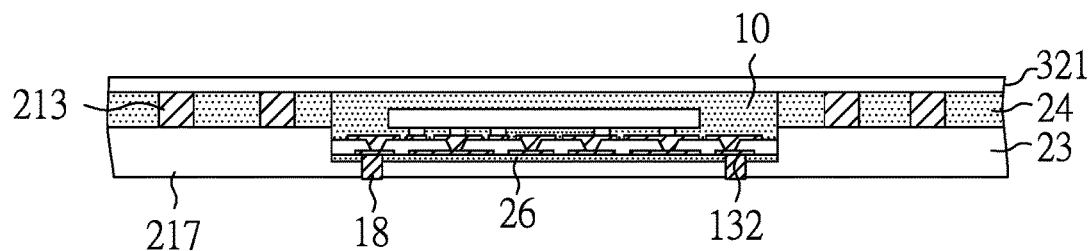
FIG. 45 is a cross-sectional view showing that the structure of FIG. 44 is provided with a second dielectric layer in accordance with the third embodiment of the present invention.

FIG. 45 is a cross-sectional view of the structure with a second dielectric layer 321 laminated/coated on the first semiconductor device 10, the metal posts 213 and the resin sealant layer 24 from above. The second dielectric layer 321 contacts and covers the top surfaces of the first semiconductor device 10, the metal posts 213 and the resin sealant layer 24.

Figure 46:
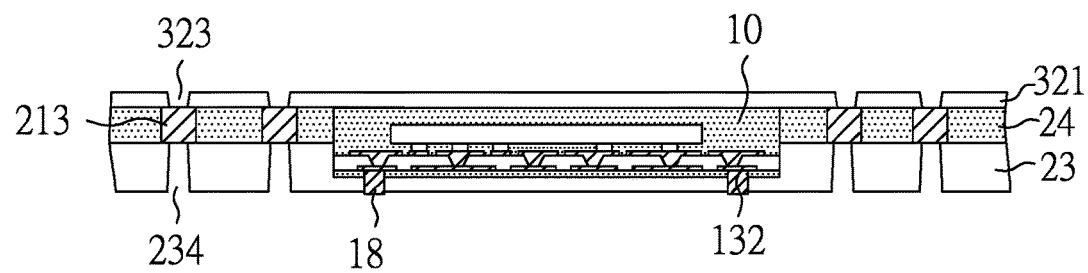
FIG. 46 is a cross-sectional view showing that the structure of FIG. 45 is provided with first and second via openings in accordance with the third embodiment of the present invention.

FIG. 46 is a cross-sectional view of the structure provided with first via openings 234 and second via openings 323. The first via openings 234 extend through the first dielectric layer 23 and are aligned with and expose the metal posts 213 in the downward direction. The second via openings 323 extend through the second dielectric layer 321 and are aligned with and expose selected portions of the metal posts 213 in the upward direction.

Figure 47:
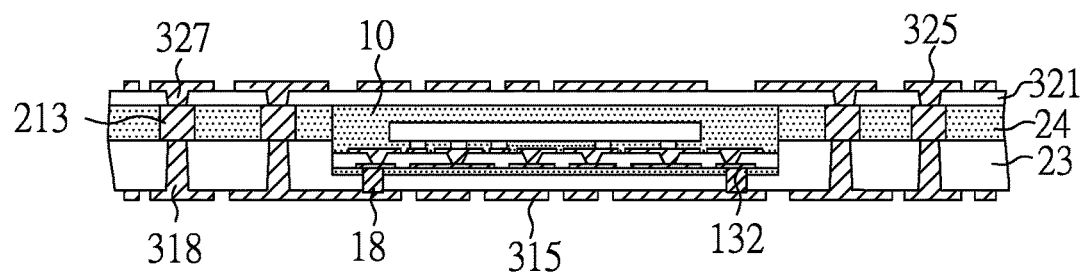
FIG. 47 is a cross-sectional view showing that the structure of FIG. 46 is provided with first and second conductive traces in accordance with the third embodiment of the present invention.

Referring now to FIG. 47, first conductive traces 315 and second conductive traces 325 are respectively formed on the first dielectric layer 23 and the second dielectric layer 321 by metal deposition and metal patterning process. The first conductive traces 315 extend from the protruded bumps 18 of the first semiconductor device 10 and the metal posts 213 in the downward direction, fill up the first via openings 234 to form first metallized vias 318 in direct contact with the metal posts 213, and extend laterally on the first dielectric layer 23. The second conductive traces 325 extend from the metal posts 213 in the upward direction, fill up the second via openings 323 to form second metallized vias 327 in direct contact with the metal posts 213, and extend laterally on the second dielectric layer 321.

Figure 48:
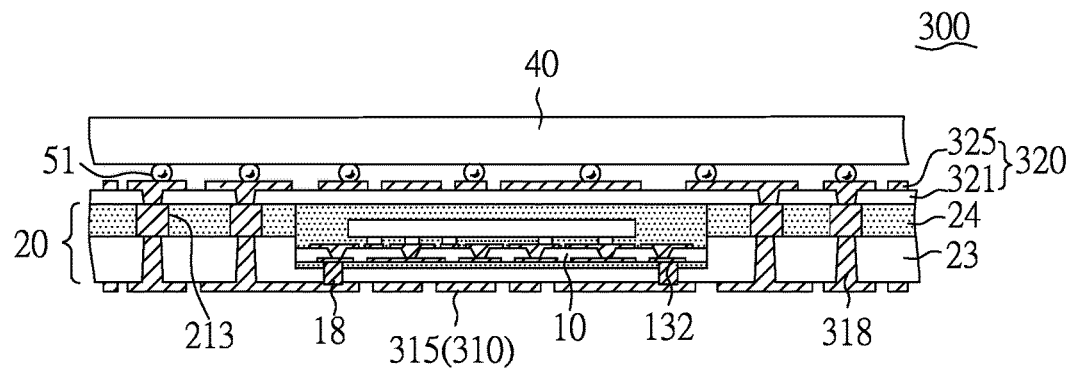
FIG. 48 is a cross-sectional view showing that another semiconductor device is mounted on the structure of FIG. 47 to finish the fabrication of a package-on-package semiconductor assembly in accordance with the third embodiment of the present invention.

FIG. 48 is a cross-sectional view of the structure provided with a second semiconductor device 40 mounted on the second conductive traces 325. The second semiconductor device 40 is electrically coupled to the first semiconductor device 10 via solder balls 51 in contact with the second conductive traces 325 and the second semiconductor device 40.

Accordingly, as shown in FIG. 48, a package-on-package semiconductor assembly 300 is accomplished and includes a first semiconductor device 10, a core base 20, a bottom buildup circuitry 310, a top buildup circuitry 320 and a second semiconductor device 40. In this illustration, the first semiconductor device 10 includes a re-distribution layer 13, a semiconductor chip 15, a mold compound 17 and protruded bumps 18; the core base 20 includes an array of metal posts 213, a first dielectric layer 23 and a resin sealant layer 24; the bottom buildup circuitry 310 includes first conductive traces 315; and the top buildup circuitry 320 includes a second dielectric layer 321 and second conductive traces 325.

The first semiconductor device 10 is face-down disposed in the recess 230 of the first dielectric layer 23, with the sidewalls of the recess 230 in close proximity to peripheral edges of the first semiconductor device 10 and the protruded bumps 18 of the first semiconductor device 10 inserted into the through-holes 231. The bottom and top buildup circuitries 310, 320 are electrically connected to each other by the metal posts 213 of the core base 20. As a result, the second semiconductor device 40 mounted on the top buildup circuitry 320 can be electrically coupled to the first semiconductor device 10 embedded in the core base 20 through the top buildup circuitry 320, the metal posts 213 and the bottom buildup circuitry 310.

Embodiment 4

Figure 49:
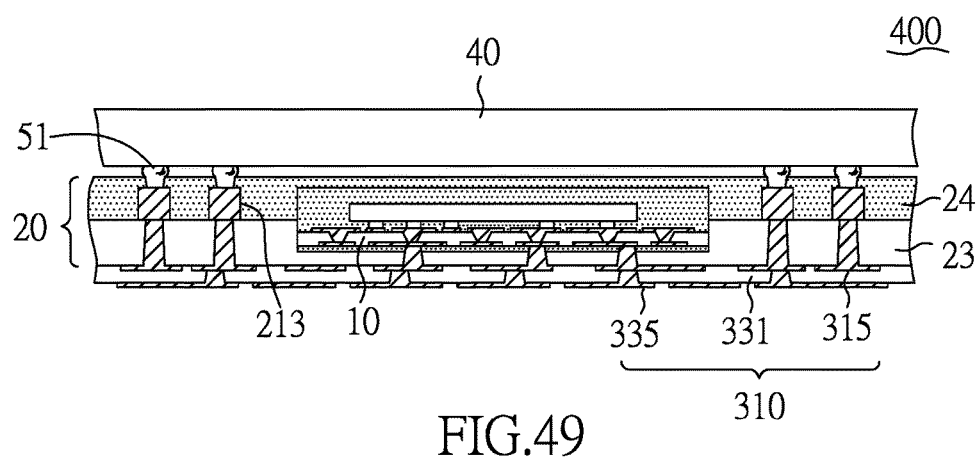
FIG. 49 is a cross-sectional view of another package-on-package semiconductor assembly in accordance with the fourth embodiment of the present invention.

FIG. 49 is a cross-sectional view of another package-on-package semiconductor assembly in which no top buildup circuitry is formed and the resin sealant layer further covers the top surfaces of the first semiconductor device and the metal posts in accordance with the fourth embodiment of the present invention.

In this embodiment, the package-on-package semiconductor assembly 400 is similar to that illustrated in Embodiment 1, except that (i) the resin sealant layer 24 has a larger thickness than that of the metal posts 213 and includes openings to expose the top surface of the metal posts 213, (ii) no top buildup circuitry is formed over the top surfaces of the first semiconductor device 10 and the core base 20, and (iii) the second semiconductor device 40 is mounted on the top surface of the metal posts 213 via solder balls 51 that extend into the openings of the resin sealant layer 24 and are in contact with the metal posts 213. As a result, the second semiconductor device 40 is electrically coupled to the first semiconductor device 10 through the metal posts 213 and the bottom buildup circuitry 310.

Embodiment 5

Figure 50:
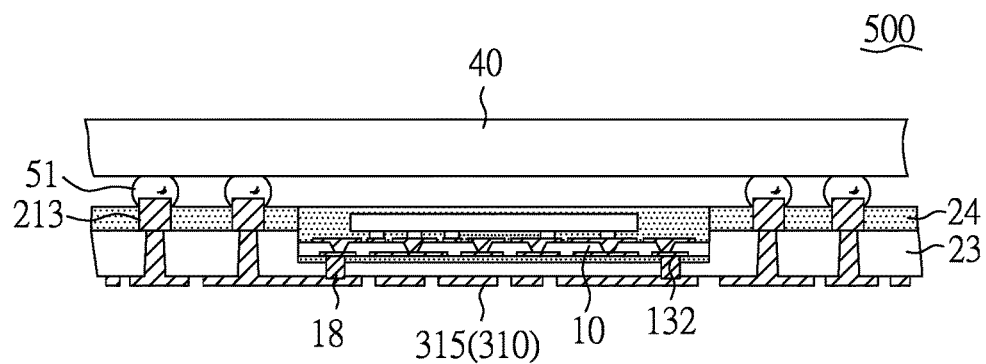
FIG. 50 is a cross-sectional view of yet another package-on-package semiconductor assembly in accordance with the fifth embodiment of the present invention.

FIG. 50 is a cross-sectional view of yet another package-on-package semiconductor assembly in which no top buildup circuitry is formed and the first semiconductor device 10 and the metal posts 213 protrude out from the resin sealant layer 24 in accordance with the fifth embodiment of the present invention.

In this embodiment, the package-on-package semiconductor assembly 500 is similar to that illustrated in Embodiment 3, except that (i) the metal posts 213 have a larger thickness than that of the resin sealant layer 24, (ii) no top buildup circuitry is formed over the top surfaces of the first semiconductor device 10 and the core base 20, and (iii) the second semiconductor device 40 is mounted on the top surface of the metal posts 213 via solder balls 51 in contact with the protruded portion of the metal posts 213. As a result, the second semiconductor device 40 is electrically coupled to the first semiconductor device 10 through the metal posts 213 and the bottom buildup circuitry 310.

The package-on-package semiconductor assemblies described above are merely exemplary. Numerous other embodiments are contemplated. In addition, the embodiments described above can be mixed-and-matched with one another and with other embodiments depending on design and reliability considerations. For instance, the first dielectric layer may include multiple recesses arranged in an array and each recess accommodates a first semiconductor device therein. Also, the bottom buildup circuitry can include additional conductive traces to receive and route additional active pads of additional first semiconductor devices.

As illustrated in the aforementioned embodiments, a distinctive package-on-package semiconductor assembly is configured and includes a core base, a first semiconductor device, a bottom buildup circuitry and a second semiconductor device, wherein the first semiconductor device is accommodated in the core base and electrically coupled to the bottom buildup circuitry disposed under a bottom surface of the core base, and the core base provides vertical routing to proceed with package-on-package interconnection procedure for the second semiconductor device disposed over a top surface of the core base and electrically coupled to the first semiconductor device through the bottom buildup circuitry.

In a preferred embodiment, the core base includes a dielectric layer, a resin sealant layer, a recess in the dielectric layer, and an array of metal posts in the resin sealant layer. The first semiconductor device can be packaged in the core base and electrically coupled to the bottom buildup circuitry by the steps of: forming a protruded metal platform on a bottom surface of a metal carrier; forming a dielectric layer covering the protruded metal platform and the bottom surface of the metal carrier; forming an array of metal posts over a top surface of the dielectric layer by removing a portion of the metal carrier; forming a recess in the dielectric layer by removing the protruded metal platform; attaching a first semiconductor device in the recess of the dielectric layer by an adhesive, wherein the first semiconductor device extends into the recess of the dielectric layer and is laterally covered by a resin sealant layer disposed over the top surface of the dielectric layer and has active pads at its bottom surface; and forming a bottom buildup circuitry under a bottom surface of the dielectric layer, wherein the bottom buildup circuitry is electrically coupled to the active pads of the first semiconductor device and the metal posts. Accordingly, the core base can serve as a flat platform and provide vertical routing for the next package-on-package interconnection, and the package-on-package semiconductor assembly can be accomplished by a step of electrically coupling a second semiconductor device to the metal posts. Specifically, the second semiconductor device is disposed over a top surface of the core base and is electrically coupled to the first semiconductor device through the metal posts and the bottom buildup circuitry.

Unless specifically indicated or using the term "then" between steps, or steps necessarily occurring in a certain order, the sequence of the above-mentioned steps is not limited to that set forth above and may be changed or reordered according to desired design.

The first semiconductor device can be a packaged or unpackaged chip. For instance, the first semiconductor device may be a packaged chip that can be fabricated by a pane scale process followed by a singulation process and includes a semiconductor chip, a re-distribution layer and a mold compound. The re-distribution layer has active pads at its bottom surface for interconnection with the bottom buildup circuitry, and the semiconductor chip is disposed over a top surface of the re-distribution layer and electrically coupled to the active pads of the re-distribution layer and surrounded by the mold compound. In a preferred embodiment, the first semiconductor device can be fabricated by steps of: forming a re-distribution layer on a sacrificial carrier; electrically coupling a semiconductor chip to the re-distribution layer; forming a mold compound that covers the re-distribution layer and the semiconductor chip; and removing the sacrificial carrier. Additionally, the first semiconductor device may further include protruded bumps on the active pads.

The dielectric layer of the core base preferably contains glass fiber and has a recess to accommodate the first semiconductor device. The recess of the dielectric layer has a floor and sidewalls that extend from the floor to the top surface of the dielectric layer. The sidewalls of the recess of the dielectric layer are laterally aligned with and in close proximity to the peripheral edges of the first semiconductor device. As the sidewalls of the recess extend from the floor of the recess and extend beyond the bottom surface of the first semiconductor device, the sidewalls of the recess can confine the dislocation of the first semiconductor device laterally and provide the placement accuracy of the first semiconductor device in the recess. Further, in the case of the first semiconductor device having protruded bumps thereon, the dielectric layer further has an array of through-holes extending through the dielectric layer at the floor of the recess so as to permit the protruded bumps of the first semiconductor device to extend through and be exposed from the through-holes of the dielectric layer.

The resin sealant layer can be free of glass fiber, and may be formed before or after the step of attaching the first semiconductor device in the recess of the dielectric layer. For instance, after removing a selected portion of the metal carrier to from metal posts and a metal slug that covers the protruded metal platform, the resin sealant layer can be provided to cover sidewalls of the metal slug and the metal posts, followed by removing the metal slug and the protruded metal platform to form an aperture in the resin sealant and a recess in the dielectric layer. As a result, the first semiconductor device can be inserted through the aperture of the resin sealant layer and into the recess of the dielectric layer, and be retained at a predetermined location using the sidewalls of the recess as a dislocation controller. Alternatively, the resin sealant layer may be provided to cover sidewalls of the first semiconductor device and the metal posts after the step of attaching the first semiconductor device in the recess of the dielectric layer. Further, the resin sealant layer may have a top surface substantially coplanar with or lower than that of the metal posts so as to expose the top surface of the metal posts, or may further cover the top surface of the metal posts and have openings to expose the top surface of the metal posts.

The metal posts in the resin sealant layer can provide vertical electrical connections between both opposite sides of the core base. In a preferred embodiment, the metal posts have a thickness smaller than the total thickness of the first semiconductor device and substantially equal to the protrusion height of the first semiconductor device out of the recess, and are electrically coupled to the bottom buildup circuitry through metallized vias that extend into the dielectric layer from the bottom surface of the core base.

The core base may further include an array of auxiliary metal pads laterally covered by the dielectric layer and electrically to and disposed between the metal posts and the metallized vias of the bottom buildup circuitry. The auxiliary metal pads can be simultaneously deposited on the bottom surface of the metal carrier while forming the protruded metal platform, followed by forming the metal posts in contact with the top surface of the auxiliary metal pads. In a preferred embodiment, the auxiliary metal pads are substantially coplanar with the protruded metal platform at top and bottom surfaces thereof, and have a thickness substantially equal to the depth of the recess of the dielectric layer. Further, the diameter of the auxiliary metal pad at its top surface may be the same as or different from that of the metal post at its bottom surface.

The bottom buildup circuitry is formed under the bottom surface of the core base and provides electrical connections between the first semiconductor device and the metal posts of the core base. Specifically, the bottom buildup circuitry can include conductive traces that directly contact and extend from the active pads or the protruded bumps of the first semiconductor device as well as the metal posts or the auxiliary metal pads of the core base, and fill up via openings that extend through the dielectric layer and additional via openings that extend through the dielectric layer and the adhesive to form bottom metallized vias, and laterally extend on the bottom surface of the dielectric layer. Accordingly, the electrical connection between the first semiconductor device and the bottom buildup circuitry and between the core base and the bottom buildup circuitry can be devoid of soldering material. Optionally, a top buildup circuitry may be further formed over the top surface of the core base and between the core base and the second semiconductor device, and is electrically coupled to the bottom buildup circuitry through the metal posts and the optional auxiliary metal pads. Specifically, the top buildup circuitry can include a top dielectric layer over the top surfaces of the first semiconductor device and the core base and conductive traces that directly contact and extend from the metal posts of the core base and fill up via openings in the top dielectric layer to form top metallized vias and laterally extend on the top dielectric layer. As a result, the top buildup circuitry is electrically coupled to the metal posts and provides electrical contacts for the second semiconductor device.

The top and bottom buildup circuitries can further include additional dielectric layers, additional via openings, and additional conductive traces if needed for further signal routing. The outmost conductive traces of the top and bottom buildup circuitries can respectively accommodate conductive joints, such as solder balls, for electrical communication and mechanical attachment with another electronic device. For instance, the second semiconductor device can be mounted on the top buildup circuitry using conductive joints on the outmost conductive traces of the top buildup circuitry to form the package-on-package semiconductor assembly. The second semiconductor device can be a packaged or unpackaged chip. For instance, the second semiconductor device can be a bare chip, or a wafer level packaged die, etc.

The term "cover" refers to incomplete or complete coverage in a vertical and/or lateral direction. For instance, in the recess-up position, the dielectric layer covers the first semiconductor device in the downward direction regardless of whether another element such as the adhesive is between the dielectric layer and the first semiconductor device.

The phrase "aligned with" refers to relative position between elements regardless of whether elements are spaced from or adjacent to one another or one element is inserted into and extends into the other element. For instance, the sidewalls of the recess of the dielectric layer are laterally aligned with the first semiconductor device since an imaginary horizontal line intersects the sidewalls of the recess of the dielectric layer and the first semiconductor device, regardless of whether another element is between the sidewalls of the recess of the dielectric layer and the first semiconductor device and is intersected by the line, and regardless of whether another imaginary horizontal line intersects the first semiconductor device but not the sidewalls of the recess of the dielectric layer or intersects the sidewalls of the recess of the dielectric layer but not the first semiconductor device. Likewise, the via openings are aligned with the active pads of the first semiconductor device.

The phrase "in close proximity to" refers to a gap between elements not being wider than the maximum acceptable limit. As known in the art, when the gap between the sidewalls of the recess of the dielectric layer and the first semiconductor device is not narrow enough, the location error of the first semiconductor device due to the lateral displacement of the first semiconductor device within the gap may exceed the maximum acceptable error limit. In some cases, once the location error of the first semiconductor device goes beyond the maximum limit, it is impossible to align the predetermined portion of the first semiconductor device with a laser beam, resulting in the electrical connection failure between the first semiconductor device and the buildup circuitry. According to the active pad size of the first semiconductor device, those skilled in the art can ascertain the maximum acceptable limit for a gap between the first semiconductor device and the sidewalls of the recess of the dielectric layer through trial and error to ensure the metallized vias being aligned with the active pads of the first semiconductor device. Thereby, the description "the sidewalls of the recess of the dielectric layer are in close proximity to the peripheral edges of the first semiconductor device" means that the gap between the peripheral edges of the first semiconductor device and the sidewalls of the recess of the dielectric layer is narrow enough to prevent the location error of the first semiconductor device from exceeding the maximum acceptable error limit. For instance, the gaps in between the first semiconductor device and the sidewalls of the recess of the dielectric layer may be in a range of about 5 to 50 microns.

The phrases "electrical connection", "electrically connected" and "electrically coupled" refer to direct and indirect electrical connection. For instance, the conductive traces of the bottom buildup circuitry directly contact and are electrically connected to the active pads or the protruded bumps of the first semiconductor device, whereas the conductive traces of the top buildup circuitry are spaced from and electrically connected to the active pads of the first semiconductor device by the conductive traces of the top buildup circuitry and the metal posts of the core base.

The package-on-package semiconductor assembly according to the present invention has numerous advantages. For instance, the bottom buildup circuitry can provide signal routing with simple circuitry patterns or flexible multi-layer signal routing with complex circuitry patterns for the first and second semiconductor devices. The minimal height of the metal posts can be reduced by the amount equal to the depth of the recess such that a higher number of metal posts can be disposed. The sidewalls of the recess can provide critical placement accuracy for the first semiconductor device. The direct electrical connection between the first semiconductor device and the bottom buildup circuitry is advantageous to high I/O and high performance. The package-on-package semiconductor assembly made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A package-on-package semiconductor assembly, comprising:
    a core base that includes a dielectric layer, a resin sealant layer and an array of metal posts, wherein (i) the dielectric layer has a recess extending from a top surface of the dielectric layer, (ii) the resin sealant layer is disposed over the top surface of the dielectric layer, and (iii) the metal posts are disposed in the resin sealant layer;
    a first semiconductor device that includes a semiconductor chip, a re-distribution layer and a mold compound, the re-distribution layer having active pads at a bottom surface thereof and the semiconductor chip being disposed over a top surface of the re-distribution layer and electrically coupled to the active pads of the re-distribution layer and surrounded by the mold compound, wherein the first semiconductor device is laterally confined within the recess of the dielectric layer and with the active pads of the re-distribution layer attached to a floor of the recess of the dielectric layer by an adhesive;
    a bottom buildup circuitry under a bottom surface of the core base, wherein the bottom buildup circuitry is electrically coupled to the active pads of the re-distribution layer of the first semiconductor device through metallized vias that extend through the adhesive and the dielectric layer and is further electrically coupled to the metal posts through additional metallized vias that extend through the dielectric layer; and
    a second semiconductor device over a top surface of the core base, wherein the second semiconductor device is electrically coupled to the first semiconductor device through the metal posts and the bottom buildup circuitry.

2. The package-on-package semiconductor assembly of claim 1, wherein the dielectric layer contains glass fiber whereas the resin sealant layer is free of glass fiber.

3. The package-on-package semiconductor assembly of claim 1, further comprising a top buildup circuitry over the top surface of the core base and between the core base and the second semiconductor device, wherein the second semiconductor device is electrically coupled to the top buildup circuitry, and the top buildup circuitry is electrically coupled to the first semiconductor device through the metal posts and the bottom buildup circuitry.

4. The package-on-package semiconductor assembly of claim 1, wherein the core base further includes an array of auxiliary metal pads laterally covered by the dielectric layer and electrically coupled to and disposed between the metal posts and the additional metallized vias of the bottom buildup circuitry.

5. The package-on-package semiconductor assembly of claim 4, wherein the auxiliary metal pads have a thickness substantially equal to a depth of the recess of the dielectric layer.

6. A package-on-package semiconductor assembly, comprising:
    a core base that includes a dielectric layer, a resin sealant layer, and an array of metal posts, wherein (i) the dielectric layer has a recess extending from a top surface of the dielectric layer and an array of through-holes extending through the dielectric layer at a floor of the recess, (ii) the resin sealant layer is disposed over the top surface of the dielectric layer, and (iii) the metal posts are disposed in the resin sealant layer;
    a first semiconductor device that includes a semiconductor chip, a re-distribution layer and a mold compound, the re-distribution layer having active pads at a bottom surface thereof and the semiconductor chip being disposed over a top surface of the re-distribution layer and electrically coupled to the active pads of the re-distribution layer and surrounded by the mold compound, wherein the first semiconductor device is laterally confined within the recess of the dielectric layer and with the active pads of the re-distribution layer attached to the floor of the recess of the dielectric layer by an adhesive, wherein the first semiconductor device has protruded bumps that extend from selected ones of the active pads of the re-distribution layer through the through-holes at the floor;
    a bottom buildup circuitry under a bottom surface of the core base, wherein the bottom buildup circuitry is electrically coupled to the protruded bumps of the first semiconductor device and is further electrically coupled to the metal posts through metallized vias that extend through the dielectric layer; and
    a second semiconductor device over a top surface of the core base, wherein the second semiconductor device is electrically coupled to the first semiconductor device through the metal posts and the bottom buildup circuitry.

7. The package-on-package semiconductor assembly of claim 6, further comprising a top buildup circuitry over the top surface of the core base and between the core base and the second semiconductor device, wherein the second semiconductor device is electrically coupled to the top buildup circuitry, and the top buildup circuitry is electrically coupled to the first semiconductor device through the metal posts and the bottom buildup circuitry.

* * * * *